US011632873B1

(12) United States Patent
Doglio et al.

(10) Patent No.: US 11,632,873 B1
(45) Date of Patent: Apr. 18, 2023

(54) MULTIPURPOSE CHASSIS FRONT TRIM PIECE

(71) Applicant: Dell Products L.P., Round Rock, TX (US)

(72) Inventors: Jean Marie Doglio, Round Rock, TX (US); Richard William Guzman, Austin, TX (US); Sean Padrig Odonnell, Poughkeepsie, NY (US)

(73) Assignee: Dell Products L.P., Round Rock, TX (US)

( * ) Notice: Subject to any disclaimer, the term of this patent is extended or adjusted under 35 U.S.C. 154(b) by 38 days.

(21) Appl. No.: 17/498,142

(22) Filed: Oct. 11, 2021

(51) Int. Cl.
*H05K 7/18* (2006.01)
*H05K 7/20* (2006.01)

(52) U.S. Cl.
CPC .......... *H05K 7/18* (2013.01); *H05K 7/20127* (2013.01); *H05K 7/20709* (2013.01)

(58) Field of Classification Search
CPC ... H05K 7/18; H05K 7/20127; H05K 7/20709
USPC .................................................. 361/679.46
See application file for complete search history.

(56) References Cited

U.S. PATENT DOCUMENTS

| 4,120,021 | A | * | 10/1978 | Roush | F25B 5/02 |
| | | | | | 361/698 |
| 4,462,564 | A | * | 7/1984 | Alves | G12B 9/00 |
| | | | | | 455/345 |
| 4,699,270 | A | * | 10/1987 | Bohm | H05K 5/0021 |
| | | | | | 220/532 |
| 4,868,715 | A | * | 9/1989 | Putman | B60K 37/04 |
| | | | | | 361/810 |
| 4,895,326 | A | * | 1/1990 | Nimpoeno | B60R 11/0205 |
| | | | | | 455/345 |
| D410,456 | S | * | 6/1999 | Fu | D14/444 |
| 6,288,336 | B1 | * | 9/2001 | Chen | G06F 1/181 |
| | | | | | 174/373 |
| 6,496,366 | B1 | * | 12/2002 | Coglitore | G06F 1/20 |
| | | | | | 361/679.48 |
| 7,042,721 | B2 | * | 5/2006 | Olesiewicz | G06F 1/187 |
| | | | | | 361/695 |
| D583,383 | S | * | 12/2008 | Saylor | D14/441 |
| D748,627 | S | * | 2/2016 | Russette | D14/356 |
| D795,877 | S | * | 8/2017 | Barron | D14/432 |
| D835,111 | S | * | 12/2018 | Guzman | D14/444 |
| 10,788,868 | B1 | * | 9/2020 | Crisp | G06F 1/206 |

(Continued)

*Primary Examiner* — Anatoly Vortman
(74) *Attorney, Agent, or Firm* — Womble Bond Dickinson (US) LLP

(57) ABSTRACT

Devices, systems, and methods for managing server chassis are disclosed. The server chassis may be managed thermally by controlling a flow of gas through an opening in the server chassis. The server chassis may be managed for security by controlling physical access to various portions of the server chassis, and, for example, to a portion of the server chassis proximate to an opening in the server chassis through which gas flows for thermal management purposes. The server chassis may also be managed electromagnetically by controlling a flow of electromagnetic radiation into and out of the server chassis and, for example, through an opening in the server chassis through which gas flows for thermal management purposes. The server chassis may also be managed structurally by physically reinforcing various portions of the server chassis.

20 Claims, 13 Drawing Sheets

(56) References Cited

U.S. PATENT DOCUMENTS

| | | | |
|---|---|---|---|
| 2003/0020384 A1* | 1/2003 | Bush | A47B 88/95 |
| | | | 312/348.4 |
| 2003/0030989 A1* | 2/2003 | Kitchen | H04L 63/1416 |
| | | | 361/679.33 |
| 2008/0043408 A1* | 2/2008 | Quilling | B60R 11/02 |
| | | | 361/679.01 |
| 2016/0209868 A1* | 7/2016 | Hartman | G06F 1/181 |
| 2019/0227604 A1* | 7/2019 | Bargerhuff | H05K 7/1492 |
| 2022/0186941 A1* | 6/2022 | Todd | F24C 15/14 |

* cited by examiner

MULTIPURPOSE CHASSIS FRONT TRIM PIECE

FIELD OF THE DISCLOSURE

Embodiments disclosed herein generally relate to a trim piece assembly for a server chassis of an electronic rack. More particularly, embodiments disclosed herein relate to systems and methods to manage components positioned in a server chassis using trim pieces and assemblies including trim pieces.

BACKGROUND

Computing devices may provide various types of computer implemented services. To provide the computer-implemented services, computing devices may include various type of hardware devices such as, for example, processors, memory modules, and storage devices. These hardware components may need to be positioned with one another to provide their respective functions. Similarly, various components devices may be aggregated together to form a computing system.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
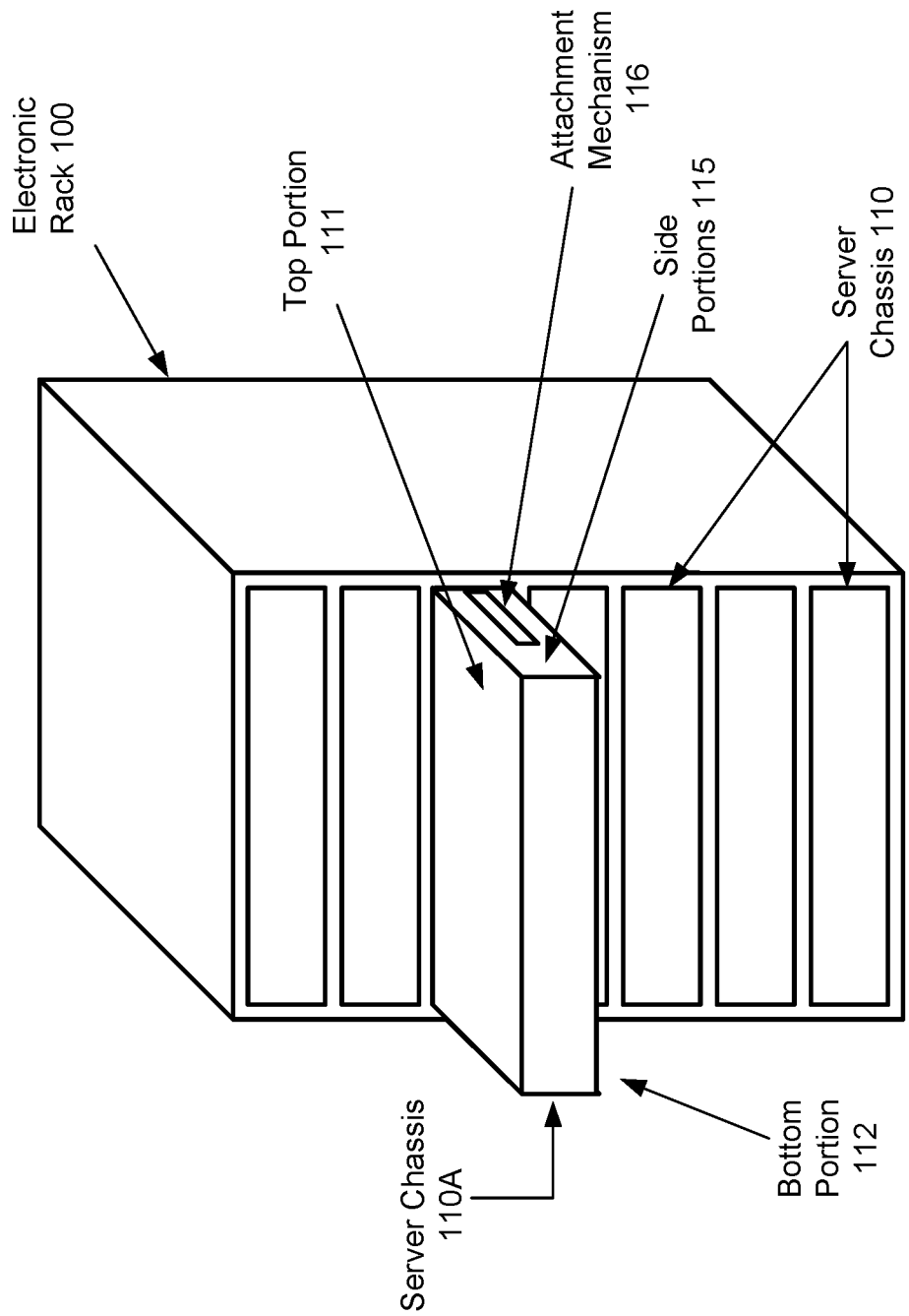
FIG. 1 is a diagram illustrating an electronic rack housing a plurality of server chassis in accordance with an embodiment.

Various embodiments will be described with reference to details discussed below, and the accompanying drawings will illustrate the various embodiments. The following description and drawings are illustrative of the embodiment disclosed herein and are not to be construed as limiting the disclosed embodiments. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrases "in one embodiment", "an embodiment", and similar recitations in various places in the specification do not necessarily all refer to the same embodiment.

In general, embodiments disclosed herein relate to devices, systems, and methods for managing server chassis. The server chassis may be managed thermally by controlling a flow of gas through an opening in the server chassis. The server chassis may be managed for security by controlling physical access to various portions of the server chassis, and, for example, to a portion of the server chassis proximate to an opening in the server chassis through which gas flows for thermal management purposes. The server chassis may also be managed electromagnetically by controlling a flow of electromagnetic radiation into and out of the server chassis and, for example, through an opening in the server chassis through which gas flows for thermal management purposes. The server chassis may also be managed structurally by physically reinforcing various portions of the server chassis.

In an embodiment, a server chassis is managed using a trim piece. The trim piece may be a physical device that may reversibly attach to the server chassis. The trim piece may include fluid flow channels to allow for thermal management of a server chassis to which the trim piece is attached. The trim piece may include various structural elements that allow for forces to be transferred from the server chassis (e.g., due to loading) to the trim piece thereby reducing the susceptibility of the server chassis to deformation.

In an embodiment, the trim piece includes one or more panels positioned with fluid flow paths. The panels may (i) restrict physical access through the fluid flow paths, (ii) modify the impedance to flow of fluid through the fluid flow paths (e.g., to modify gas flow distributions into a server chassis), (iii) restrict, modify, limit, or otherwise manage electromagnetic interference generated by or being subjected to by components positioned in a server chassis, and/or (iv) facilitate attachment, positioning, and/or orienting of other components such as bezels to the server chassis. By managing server chassis using trim pieces, each server chassis may be provided with management customized to its own needs.

In an embodiment, a trim piece assembly for a server chassis is provided. The trim piece assembly may include a server chassis opening frame adapted to: reversibly attach to a front of the server chassis; and structurally reinforce the server chassis while the server chassis opening frame is attached to the front of the server chassis. The trim piece assembly may also include a pair of extensions adapted to reversibly attach to corresponding ears of the server chassis, each of the pair of extensions being positioned with opposite sides of the server chassis opening frame, the server chassis opening frame and the pair of extensions covering a full outer profile of the server chassis while the pair of extensions are attached to the server chassis, the full outer profile of the server chassis circumscribing an opening in the front of the server chassis through which an airflow traverses to thermally manage components positioned in the server chassis; fluid flow paths through the server chassis opening frame to allow the airflow into the server chassis through the server chassis opening frame while the pair of extensions are attached to the ears of the server chassis; and a panel corresponding to a fluid flow path of the fluid flow paths, the panel being adapted to manage physical access to the server chassis through the fluid flow path.

The trim piece assembly may also include attachment members positioned with the server chassis opening frame, the attachment members are adapted to, while the pair of extensions are attached to the corresponding ears of the server chassis, reversibly attach to portions of the server chassis that define an outer profile of the opening in the front of the server chassis to form first joints between the server chassis opening frame and the server chassis, while the first joints and the server chassis opening frame maintain a shape of the outer profile of the opening in the front of the server chassis by structurally reinforcing the server chassis.

The attachment members may be adapted to reversibly attach to the portions of the server chassis with a movement of the trim piece toward the server chassis while an outer profile of the server chassis opening frame is aligned with the outer profile of the opening in the front of the server chassis, wherein the first joints do not restrict a second movement of the trim piece away from the server chassis, the second movement disjointing the first joints.

The pair of extensions may be adapted to, while attached to the corresponding ears of the server chassis, form second joints between the server chassis and the trim piece, the second joints restricting all movement of the server chassis opening frame with respect to the server chassis.

At least one of the pair of extensions may include a portion of at least two locking mechanisms forming one of the second joints, each of the at least two locking mechanisms being orthogonal to other locking mechanisms of the at least two locking mechanisms to prevent movement of the trim piece with respect to the server chassis in directions corresponding to the at least two locking mechanisms with each of the directions being orthogonal to the other directions, and wherein the server chassis opening frame and the pair of extensions are adapted to transmit a force to the ears of the server chassis with the second joints and the force being received from the server chassis with the first joints.

The fluid flow paths through the server chassis opening frame may include a first opening 360 having a first cross section of substantially rectangular shape; and a second opening 370 having a second cross section of substantially rectangular shape, the server chassis opening frame may include first divider walls that separate the first opening 360 from the second opening 370; and second divider walls that separate at least one of the first opening 360 and the second opening 370 from at least one of the pair of extensions.

The server chassis opening frame may include a panel retention mechanism positioned with the first opening 360. The panel retention mechanism may be adapted to: prevent, while the panel is positioned in a first fluid flow path of the fluid flow paths, removal of the panel from one opening of the first fluid flow path; allow, while the panel is positioned in the first fluid flow path, removal of the panel from another opening of the first fluid flow path, the openings of the fluid flow path being positioned with opposite sides of the server chassis opening frame; and reversibly interlock the panel to a portion of the server chassis opening frame that circumscribes the first opening 360.

The panel may include first openings 360 that allow gasses to flow through a first fluid flow path of the fluid flow paths while the panel is positioned in the first fluid flow path, the trim piece may also include a second panel, the second panel may include second openings 370 that allow gasses to flow through a second fluid flow path of the fluid flow paths while the second panel is positioned in the second fluid flow path, the panel may present a first impedance to the flow of gasses through the first fluid flow path while the panel is positioned in the first fluid flow path, the second panel may present a second impedance to the flow of gasses through the second fluid flow path while the second panel is positioned in the second fluid flow path, and the first impedance and the second impedance may be different to preferentially flow the gasses through the first fluid flow path or the second fluid flow path.

The panel may include a body; and openings through the body, the body and the openings through the body may be adapted to restrict transmission of electromagnetic radiation through the fluid flow path while allowing gasses to flow through the fluid flow path.

The body may include a conductive material, the conductive material and the openings through the body may form an electromagnetic interference screen, the openings in the body may have cross sectional shapes and sizes forming sub-wavelength apertures for a portion of the electromagnetic radiation having a spectral content below a predetermined frequency, the sub-wavelength apertures may reflect the portion of the electromagnetic radiation when the portion of the electromagnetic radiation is incident on the panel.

The panel may include a body; and openings through the body, the openings may include first openings 360 having first cross sectional shapes and sizes adapted to, while the panel is positioned in the fluid flow path, prevent physical access to a region proximate to a second side of the server chassis opening frame from a first side of the server chassis opening frame while the panel is positioned in the fluid flow path.

The openings may include second openings 370 having second cross sectional shapes and second sizes adapted to, while the panel is positioned in the fluid flow path, provide physical access to the region proximate to the second side of the server chassis opening frame from the first side of the server chassis opening frame while the panel is positioned in the fluid flow path.

A trim piece assembly may also include a bezel. The bezel may include a body; openings through the body; and a panel retention mechanism, the bezel may be adapted to reversibly attach to the pair of extensions, while attached to the pair of extensions, the openings may be aligned with the fluid flow paths, and the panel retention mechanism may be adapted to reversibly interlock with the panel, the panel being positioned in the fluid flow path while the panel is interlocked with the panel retention mechanism and the bezel is attached to the pair of extensions.

In an embodiment, a computing device is provided. The computing device may include a server chassis that includes an opening through which gasses flow to thermally manage computing components positioned in the server chassis; and a pair of ears positioned on opposite sides of the opening; and a first portion of the computing components being arranged in stacks positioned proximate to the opening, the stacks being separated from each other by channels; a second portion of the computing components positioned away from the opening, the first portion being positioned between the second portion and the opening; a trim piece assembly, including a server chassis opening frame adapted to: reversibly attach to a front of the server chassis; and structurally reinforce the server chassis while the server chassis opening frame is attached to the front of the server chassis; a pair of extensions adapted to reversibly attach to the pair of ears, each of the pair of extensions being positioned with opposite sides of the server chassis opening frame, the server chassis opening frame and the pair of extensions covering a full outer profile of the server chassis while the pair of extensions are attached to the server chassis, the full outer profile of the server chassis circumscribing the opening; fluid flow paths through the server chassis opening frame to allow an airflow through the server chassis via the server chassis opening frame while the pair of extensions are attached to the ears of the server chassis; and a panel corresponding to a fluid flow path of the fluid flow paths, the panel being adapted to manage physical access to the server chassis through the fluid flow path.

The fluid flow paths through the server chassis opening frame may include a first opening 360 having a first cross section of substantially rectangular shape; and a second opening 370 having a second cross section of substantially rectangular shape, the server chassis opening frame may include first divider walls that separate the first opening 360 from the second opening 370; and second divider walls that separate at least one of the first opening 360 and the second opening 370 from at least one of the pair of extensions, the first divider walls and the second divider walls may correspond to fluid flow paths through which the airflow traverses to a first portion of the computing components being arranged in stacks positioned proximate to the opening, the stacks being separated from each other by channels, and a second portion of the computing components positioned away from the opening, the first portion being positioned between the second portion and the opening.

The panel may include a body; and first openings 360 through the body, the first openings 360 having first cross sectional shapes and sizes adapted to, while the panel is positioned in the fluid flow path, prevent physical access to a region proximate to a second side of the server chassis opening frame from a first side of the server chassis opening frame while the panel is positioned in the fluid flow path; and second openings 370 through the body, the second openings 370 having second cross sectional shapes and second sizes adapted to, while the panel is positioned in the fluid flow path, provide physical access to the region proximate to the second side of the server chassis opening frame from the first side of the server chassis opening frame while the panel is positioned in the fluid flow path.

The panel may include first openings 360 that allow gasses to flow through the corresponding fluid flow path, while the panel is positioned in the corresponding fluid flow path, to the first portion of the computing components, the trim piece assembly may further include a second panel, the second panel may include second openings 370 that allow the gasses to flow through a second fluid flow path of the fluid flow paths, while the second panel is positioned in the second fluid flow path, to the second portion of the computing components. The panel may present a first impedance to the flow of the gasses through the corresponding fluid flow path while the panel is positioned in the corresponding fluid flow path, the second panel may present a second impedance to the flow of the gasses through the second fluid flow path while the second panel is positioned in the second fluid flow path, and the first impedance and the second impedance may be different to preferentially direct the flow the gasses through the corresponding fluid flow path or the second fluid flow path.

In an embodiment, an electronic rack is provided. The electronic rack may include computing devices positioned in the electronic rack, a computing device of the computing devices may include a server chassis including an opening through which gasses flow to thermally manage computing components positioned in the server chassis; and a pair of ears positioned on opposite side of the opening; and a first portion of computing components being arranged in stacks positioned proximate to the opening, the stacks being separated from each other by channels; a second portion of the computing components positioned away from the opening, the first portion being positioned between the second portion and the opening; a trim piece assembly, including a server chassis opening frame adapted to: reversibly attach to a front of the server chassis; and structurally reinforce the server chassis while the server chassis opening frame is attached to the front of the server chassis; a pair of extensions adapted to reversibly attach to the pair of ears, each of the pair of extensions being positioned with opposite sides of the server chassis opening frame, the server chassis opening frame and the pair of extensions covering a full outer profile of the server chassis while the pair of extensions are attached to the server chassis, the full outer profile of the server chassis circumscribing the opening; fluid flow paths through the server chassis opening frame to allow an airflow through the server chassis via the server chassis opening frame while the pair of extensions are attached to the ears of the server chassis; and a panel corresponding to a fluid flow path of the fluid flow paths, the panel being adapted to manage physical access to the server chassis through the fluid flow path.

A second trim piece assembly of a second computing device of the computing devices may include second fluid flow paths that allow second gasses to flow through a second server chassis of the second computing device while the second trim piece assembly is positioned with the second server chassis to cover an opening in the second server chassis, the second fluid flow paths corresponding to a distribution of computing component positioned in the second server chassis, the distribution of the computing components positioned in the second server chassis being different from a distribution of the computing components positioned in the server chassis.

The panel may include a body; and first openings 360 through the body, the first openings 370 having first cross sectional shapes and sizes adapted to, while the panel is positioned in the fluid flow path, prevent physical access to a region proximate to a second side of the server chassis opening frame from a first side of the server chassis opening frame while the panel is positioned in the fluid flow path; and second openings 360 through the body, the second openings 370 having second cross sectional shapes and second sizes adapted to, while the panel is positioned in the fluid flow path, provide physical access to the region proximate to the second side of the server chassis opening frame from the first side of the server chassis opening frame while the panel is positioned in the fluid flow path.

Turning to FIG. 1, a diagram illustrating electronic rack 100 in accordance with an embodiment is shown. Electronic rack 100 may be used to store computing devices within one or more server chassis 110. Server chassis 110 may be physical devices for housing components such as computing devices.

The computing device housed in server chassis 110A may include one or more components. The component may include, for example, device stacks that vary in size and number of devices in each device stack, with any of the devices in any of the device stacks varying in shape, performance, functionality, and/or other characteristics. In an embodiment, one or more device stacks include one or more of the following types of components: (i) memory modules such as random access memory (RAM), (ii) processing devices such as a central processing unit (CPU), (iii) storage devices such as hard disk drives, solid state drives, etc., and/or (iv) input and output (I/O) devices. The device stacks may include different types of devices without departing from embodiments disclosed herein.

One or more of server chassis 110, such as server chassis 110A, within electronic rack 100 may include top portion 111, bottom portion 112, side portions 115, and/or one or more of attachment mechanism 116. Each of these portions of a server chassis is discussed is discussed below.

Top portion 111 may provide a portion of a housing to protect components within server chassis 110. Top portion 111 may be implemented with, for example, a sheet of material. In an embodiment, top portion 111 is removable or adjustable to allow access to an interior of the housing for accessing components positioned there.

Bottom portion 112 may provide a second portion of the housing. In an embodiment, server chassis 110 within electronic rack 100 may include two or more side portions 115 (e.g., on opposite sides of an interior of the housing). Bottom portion 112 may be implemented with, for example, a sheet of material.

Side portions 115 may provide portions of the housing. Side portions 115 may be implemented with sheets of material. Side portions 115 may be reversibly and/or permanently attached to top portion 111 and/or bottom portion 112 to bound corresponding sides of the housing.

In an embodiment, an attachment mechanism 116 is positioned with one or more of side portions 115. Attachment mechanism 116 may provide for reversible attachment of a server chassis to electronic rack 100. Attachment mechanism 116 may also allow for translation of a server chassis into and/or out of electronic rack 100. For example, attachment mechanism 116 may be implemented with a sliding joint that allows, while a server chassis is attached to electronic rack 100 through the sliding joint, translation (e.g., to a limited degree) of the server chassis into and out of an interior of electronic rack 100 through a corresponding opening in electronic rack 100. While illustrated in FIG. 1 with a specific position, any number of attachment mechanisms may be positioned with different portions of a server chassis to facilitate positioning, orienting, and/or managing of server chassis with electronic rack 100.

In an embodiment, server chassis 110 include a conductive material (and/or other materials). The conductivity, shape, and other characteristics of the conductive material may limit electromagnetic radiation propagation. For example, the conductive material may reduce (or prevent) propagation of electromagnetic interference through top portion 111, bottom portion 112, and/or side portions 115. However, electromagnetic radiation may still, for example, propagate into and/or out of an interior of a server chassis through other sides (e.g., such as a front side through which airflow for thermal management purposes may flow). In an embodiment, the conductive material is aluminum. The conductive material may be other types of conductive materials without departing from embodiments disclosed herein. Server chassis 110 may also include non-conductive and/or other types of materials.

In an embodiment, electronic rack 100 includes openings and/or corresponding attachment points for attachment mechanisms of server chassis 110 to stack any number of server chassis 110 with respect to one another. The openings and/or attachment points may be positioned based on presumed dimensions of server chassis 110. However, due to the types of materials, thicknesses of panels, and/or other factors, the dimensions and/or other characteristics of server chassis 110 may diverge from those presumed (e.g., may diverge from nominal dimensions/characteristics).

For example, loading on bottom portion 112, top portion 111, and/or side portions 115 due to components positioned in a server chassis may cause these portions to bow, deform, warp, and/or otherwise diverge from presumed structures. Divergence of the dimensions and/or other characteristics of these portions may reduce the functionality of a server chassis by, for example, causing it to bump into other components, prevent it from appropriately moving within a predetermined space, and/or may otherwise not be desired. As will be discussed in greater details below, in an embodiment, a server chassis and/or trim piece for a server chassis in accordance with embodiments disclosed herein may provide for reduced divergence of the structure of a server chassis from a desired structure due to loading.

While illustrated in FIG. 1 with respect to a limited number of specific components in specific positions and orientations, an electronic rack may include different number and/or types of components with different positions and/or orientations without departing from embodiments disclosed herein.

Figure 2:
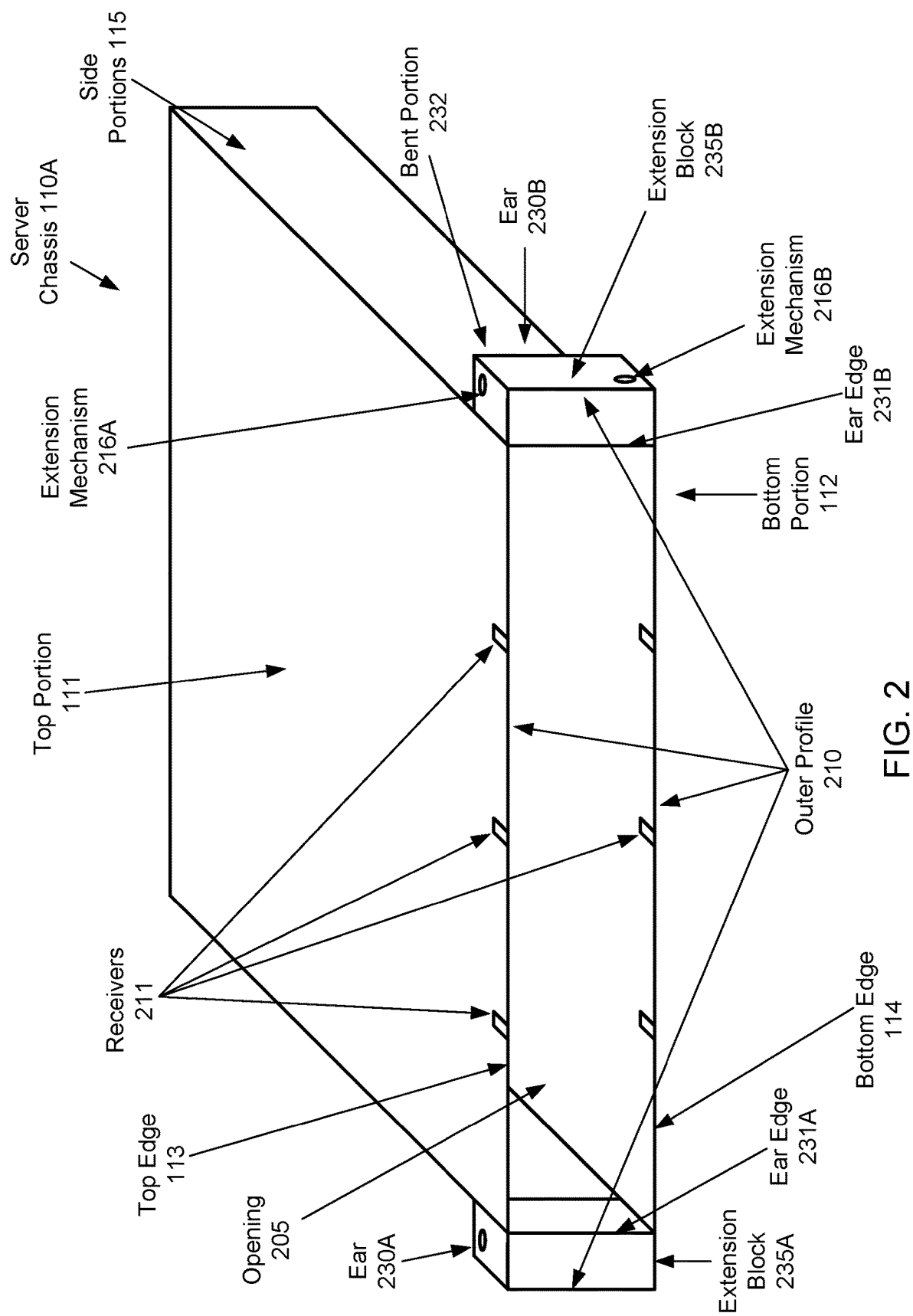
FIG. 2 is a diagram illustrating a server chassis in accordance with an embodiment.

Turning to FIG. 2, a diagram of server chassis 110A in accordance with an embodiment is shown. Server chassis 110A may be less susceptible to structural divergence from nominal specifications due to, for example, loading. To do so, server chassis 110A may be adapted to receive a trim piece, discussed in greater details with FIGS. 3-16. An electronic rack may include and/or house any number of server chassis similar to server chassis 110A.

As discussed above, server chassis 110A may include top portion 111, bottom portion 112, and side portions 115. Server chassis 110A may also include opening 205, receivers 211, ears 230A, 230B, and extension blocks 235A, 235B. Each of these portions of server chassis 110A is discussed below.

Opening 205 may be an opening on one side of a volume bounded by top portion 111, bottom portion 112, and side portions 115. Opening 205 may provide for airflow through the volume and/or access to portions of the volume. Opening 205 may be positioned with server chassis 110A so that, while server chassis 110A is positioned with an electronic rack, opening 205 may be accessible from outside of the electronic rack (e.g., by a front of the electronic rack). Opening 205 may be bounded by, for example, top edge 113 of top portion 111, bottom edge 114 of bottom portion 112, and ear edges 231A, 231B of ears 230A, 230B.

Ears 230A, 230B provide for physical extension of a front of server chassis 110A. For example, ears 230A, 230B may include physical structures positioned on opposite sides of opening 205. Ears 230A, 250 may expand a cross section of the volume defined by top portion 111, bottom portion 112, and side portions 115 near a front of server chassis 110A. The expanded cross section may allow for structural attachment of components and/or improvement of the structural rigidity of server chassis 110A.

Each of ears 230A, 230B may include an extension block 235A, 235B and/or a bent portion 232. Bent portion 232 may include a sheet of material that extends away from a side portion. For example, if a side portion is implemented with a sheet of material, a portion of the sheet may be bent at a substantially right angle to form bent portion 232.

Extension block 235A, 235B may provide for physical attachment of other components to a corresponding ear. Extension blocks 235A, 235B may be implemented with a physical structure (e.g., a block of material) attached to bent portion 232.

Figure 3:
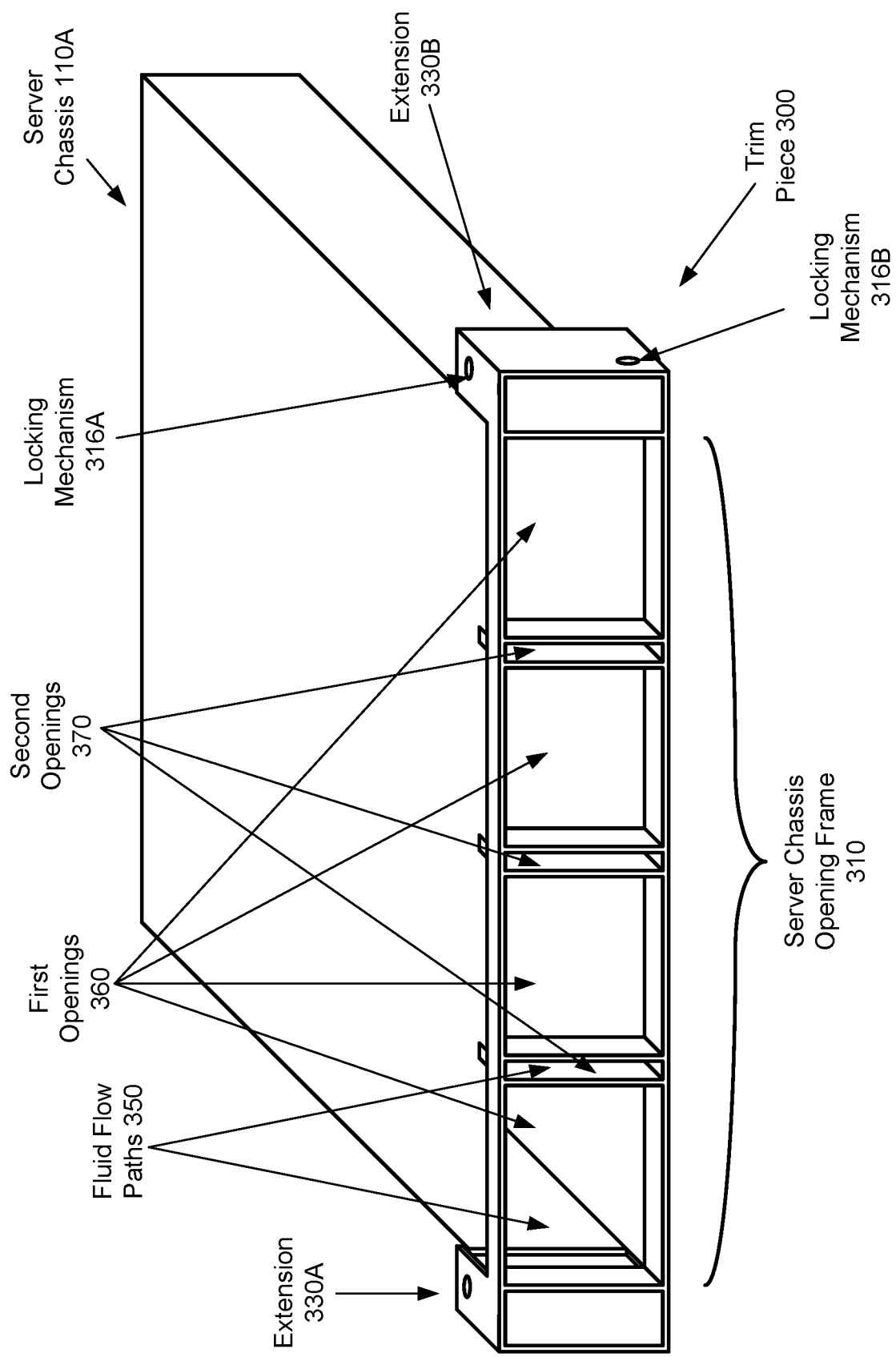
FIG. 3 is a diagram illustrating a trim piece attached to a server chassis in accordance with an embodiment.

Extension blocks 235A, 235B may include one or more locking mechanisms (e.g., 216A, 216B). Extension mechanisms 216A, 216B may allow for various structures such as a trim piece to fixedly attach to server chassis 110A. Refer to FIG. 3 for additional details regarding extension mechanisms 216A, 216B.

Top portion 111, bottom portion 112, and ears 230A, 230B may define outer profile 210 of a front side of server chassis 110. As will be discussed below, a trim piece may have a shape that corresponds to outer profile 210.

Any number of receivers 211 may be positioned with top portion 111 and bottom portion 112. Receivers 211 may provide for transmission of forces from server chassis 110A to a trim piece, thereby structurally reinforcing server chassis 110A and reducing its susceptibility to structural divergence due to loading.

Figure 14:
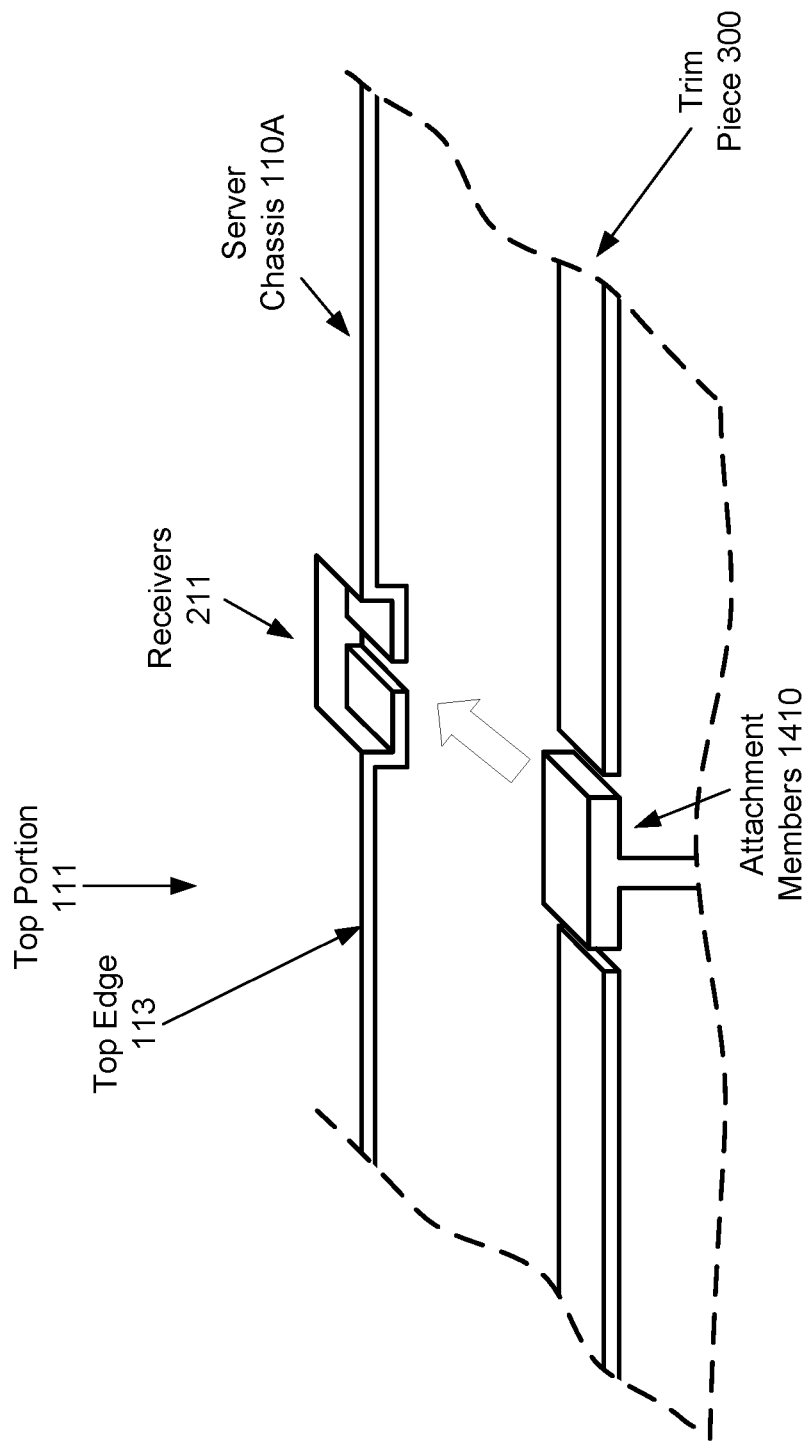
FIG. 14 is a diagram illustrating attachment members of a trim and receivers of a server chassis in accordance with an embodiment.

In an embodiment, receivers 211 are positioned with top edge 113 of top portion 111 and/or bottom edge 114 of bottom portion 112. These positions may allow for the dimension of server chassis to be better maintained by, for example, improving the planarity of top portion 111 and/or bottom portion 112, maintaining a spacing between top portion 111 and/or bottom portion 112, reducing warping of top portion 111 and/or bottom portion 112, and/or maintaining spacing between ears 235A, 235B and side portions 115. Refer to FIG. 14 for additional details regarding receivers 211.

While illustrated in FIG. 2 with respect to a limited number of specific components in specific positions and orientations, a server chassis may include different number and/or types of components with different positions and/or orientations without departing from embodiments disclosed herein.

Turning to FIG. 3, a diagram illustrating trim piece 300 attached to server chassis 110A in accordance with an embodiment is shown. Trim piece 300 may be a portion of a trim piece assembly which may also include other components such as bezels, panels, and/or other components discussed in greater detail below. While attached to server chassis 110A, trim piece 300 may cause server chassis 110A to be less susceptible to structural divergence from nominal specifications due to, for example, loading.

To provide its functionality, trim piece 300 may include server chassis opening frame 310, fluid flow paths 350, extensions 330A, 330B, and locking mechanisms 316A, 316B. Each of these portions of trim piece 300 is discussed below.

In an embodiment, server chassis opening frame 310 is a physical device usable to structurally reinforce server chassis 110A. Server chassis opening frame 310 may include structural members corresponding to an outer profile of opening 205.

Server chassis opening frame 310 may be positioned at outer profile 210 of server chassis 110A and/or in front of opening 205, shown in FIG. 2. Server chassis opening frame 310 may include and/or use attachment members to reversibly attach trim piece 300 to receivers 211 that may be positioned on top edge 113 of top portion 111 and/or on bottom edge 114 of bottom portion 112 of the server chassis 110A, as further illustrated in FIG. 14. These attachments provide joints through which forces on server chassis 110A are transmitted to server chassis opening frame 310.

Server chassis opening frame 310 may also provide for airflow through trim piece 300 into and/or out of server chassis 110A through fluid flow paths 350 when attached to server chassis 110A. In addition to airflow, server chassis opening frame 310 may also provide for access to portions of server chassis 110A while trim piece 300 is attached to server chassis 110A.

Server chassis opening frame 310 may include all, or a portion, of fluid flow paths 350, which may extend through server chassis opening frame 310. Any of fluid flow paths 350 may include an opening having a cross section of substantially rectangular shape. Fluid flow paths 350 may also include additional openings having cross sections of substantially rectangular shape. Further, server chassis opening frame 310 may include and/or use divider walls to separate various openings having a cross section of substantially rectangular shape from other openings in trim piece 300. Server chassis opening frame 310 may also include additional divider walls to separate openings of fluid flow paths 350 from extensions 330A, 330B, as discussed in further detail below.

In an embodiment, extensions 330A, 330B are physical structures for attaching trim piece 300 to server chassis 110A and reinforcing server chassis 110A when so attached. The physical structures may include, for example, wrapping portions, walls, and/or other structures corresponding to ears 230A, 230B such that extension 330A, 330B may be complementary or otherwise facilitate attachment to ears 230A, 230B.

In an embodiment, extensions 330A, 330B are adapted to reversibly attach to corresponding ears 230A, 230B located on server chassis 110A as shown in FIG. 2. Extensions 330A, 330B may also be adapted to reversibly attach to corresponding extension blocks 235A, 235B located on server chassis 110A. Each of extensions 330A, 330B of server chassis opening frame 310 may be positioned with opposite side portions 115 of server chassis 110A. Server chassis opening frame 310 and extensions 330A, 330B may cover a full outer profile of server chassis 110A while pair of extensions 330A, 330B are attached to server chassis 110A. The full outer profile of server chassis 110A may circumscribe an opening in the front of server chassis 110A through which an airflow may traverse through fluid flow paths 350 while server chassis opening frame 310 is attached to server chassis 110A in order to thermally manage components positioned in server chassis 110A.

Extensions 330A, 330B may restrict all movement of server chassis opening frame 310 with respect to the server chassis 110A when attached to server chassis 110A. Extensions 330A, 330B may include at least two locking mechanisms (e.g., 316A, 316B). Locking mechanisms 316A, 316B may form a joint with extension mechanisms 216A, 216B (e.g., by using fasteners). Each locking mechanism 316A may be orthogonal to locking mechanism 316B to prevent movement of trim piece 300 with respect to server chassis 110A. Server chassis opening frame 310 and pair of extensions 330A, 330B may be adapted to transmit a force to ears 230A, 230B of server chassis 110A through locking mechanisms 316A, 316B and extension mechanisms 216A, 216B. Such force from trim piece 300 may alternatively be transmitted to extension blocks 235A, 235B on server chassis 110A at the locations of extension mechanisms 216A, 216B.

Trim piece 300 may be manufactured with a conductive material (and/or other materials). The conductivity, shape, and other characteristics of the conductive material may limit electromagnetic radiation propagation. For example, the conductive material may reduce propagation of electromagnetic interference through extensions 330A, 330B. However, electromagnetic radiation may still, for example, propagate into and/or out of an interior of server chassis 110A through fluid flow paths 350 of server chassis opening frame 310. In an embodiment, the conductive material of trim piece 300 is aluminum. The conductive material may be other types of conductive materials without departing from embodiment disclosed herein. Trim piece 300 may also include non-conductive and/or other types of materials.

While illustrated in FIG. 3 with respect to a limited number of specific components in specific positions and orientations, a trim piece may include different number and/or types of components with different positions and/or orientations without departing from embodiments disclosed herein.

Figure 4:
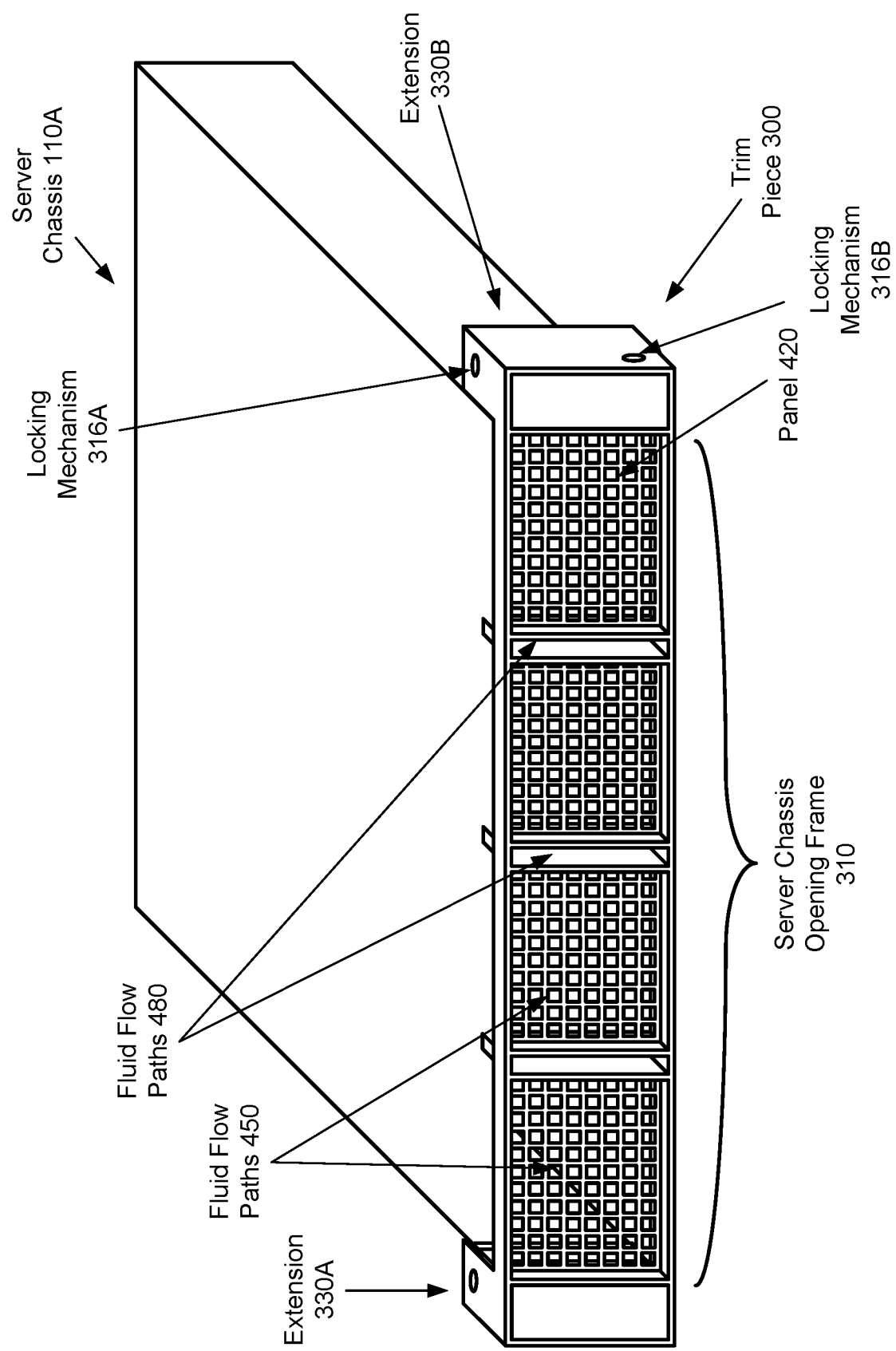
FIG. 4 is a diagram illustrating a trim piece with panels and the trim piece with panels attached to a server chassis in accordance with an embodiment.

Turning to FIG. 4, a diagram illustrating trim piece 300 attached to server chassis 110A in accordance with an embodiment is shown. While attached to server chassis 110A, trim piece 300 may include one or more panels (e.g., panel 420) to alter fluid flow paths 350 into fluid flow paths 450, 480. Each of these portions of trim piece 300 is discussed below.

Panel 420 may include a body (e.g., aluminum sheet metal, metal coated plastic materials, etc.) and openings through the body. Panel 420 may be adapted to restrict transmission of electromagnetic radiation through fluid flow paths 450 while allowing gasses to flow through fluid flow paths 450 to thermally manage components positioned in server chassis 110A. Such restrictions on the transmission of electromagnetic radiation may be based on panel 420 thickness and openings through the body of panel 420 as further discussed below.

Panel 420 may include a conductive material. This conductive material and openings through the body of panel 420 may form an electromagnetic interference screen. This may be accomplished by designing the openings in the body of panel 420 to have cross sectional shapes and sizes that form sub-wavelength apertures for a portion of the electromagnetic radiation that has a spectral content below a predetermined frequency. The sub-wavelength apertures may then reflect the portion of the electromagnetic radiation that is incident on panel 420.

Panel 420 may correspond to fluid flow paths 450. Panel 420 may include openings that allow gasses to flow through fluid flow paths 450 while the panel is positioned in fluid flow paths 450 and trim piece 300 is attached to server chassis 110A. Trim piece 300 may further include additional openings that allow gasses to flow through fluid flow paths 480 while no panel is positioned in fluid flow paths 480. In doing so, panel 420 may present an impedance to the flow of gasses through fluid flow paths 450 while panel 420 is positioned in fluid flow paths 450. Similarly, not having panel 420 may present a different impedance to the flow of gasses through fluid flow paths 480 while no panel 420 is positioned in fluid flow paths 480. By arranging trim piece 300 in this manner, the resulting different impedances may preferentially flow the gasses through fluid flow paths 450 or fluid flow paths 480 to thermally manage components positioned in server chassis 110A.

Panel 420 may also be adapted to manage physical access to server chassis 110A through fluid flow paths 450. Server chassis opening frame 310 may include a panel retention mechanism (not shown) positioned in an opening of server chassis opening frame 310. The panel retention mechanism may prevent, while panel 420 is positioned in fluid flow paths 450, removal of panel 420 from an opening in server chassis opening frame 310. Conversely, the panel retention mechanism may allow, while panel 420 is positioned in fluid flow paths 450, removal of panel 420 from an opening in server chassis opening frame 310 by reversibly interlocking panel 420 to a portion of server chassis opening frame 310 that circumscribes an opening.

While illustrated in FIG. 4 with respect to a limited number of specific components in specific positions and orientations, a trim piece may include different number and/or types of components with different positions and/or orientations without departing from embodiments disclosed herein.

Figure 5:
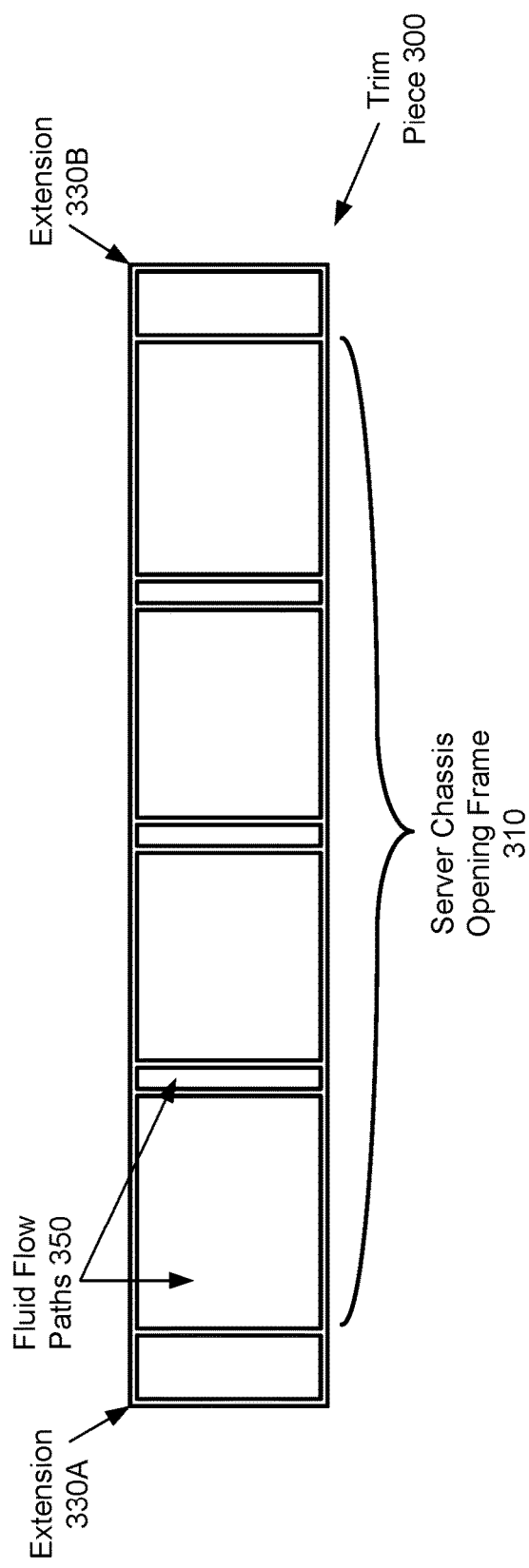
FIG. 5 is a diagram illustrating a trim piece in accordance with an embodiment.

Turning to FIG. 5, a diagram of trim piece 300 in accordance with an embodiment is shown. In FIG. 5, a view looking toward a front of a trim piece may be depicted.

In an embodiment, trim piece 300 may also include openings within extensions 330A, 330B to thermally manage components positioned in server chassis 110A. To thermally manage the components, various fluid flow paths may correspond to positioning of to-be-thermally-managed components in a server chassis as well as airflow paths through server chassis. The sizes and shapes of fluid flow paths 350 may be set based on the positioning of these components and fluid flow paths. Consequently, trim pieces for use with different server chassis (that may include different component positions therein) may include fluid flow paths 350 with different structures.

While illustrated in FIG. 5 with respect to a limited number of specific components in specific positions and orientations, a trim piece may include different number and/or types of components with different positions and/or orientations without departing from embodiments disclosed herein.

Figure 6:
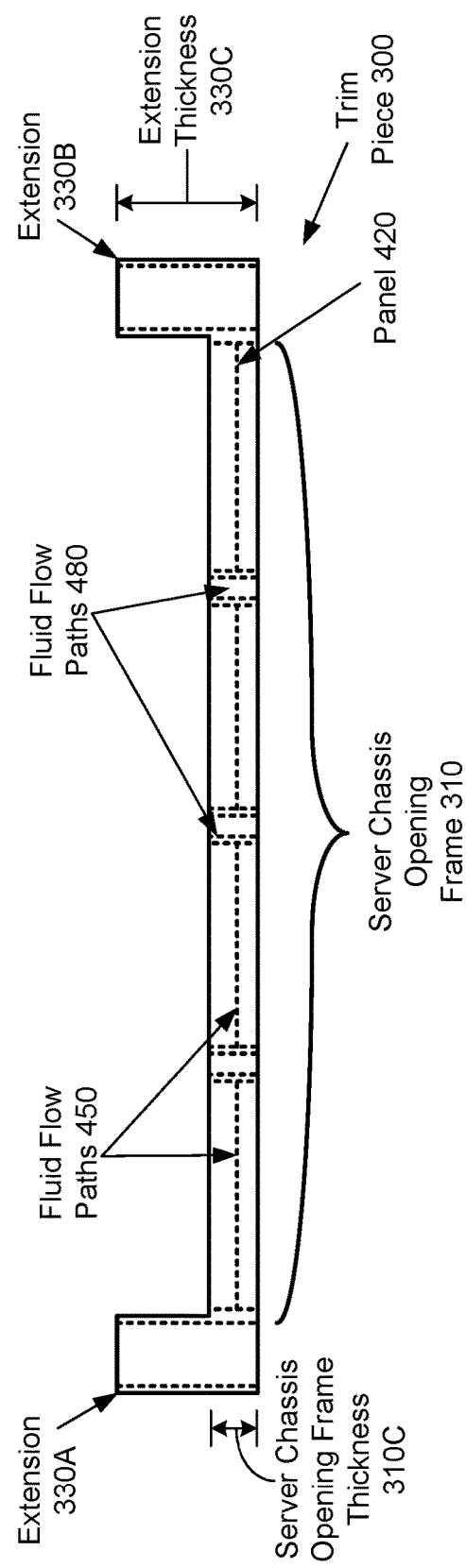
FIG. 6 is a diagram illustrating a trim piece with panels in accordance with an embodiment.

Turning to FIG. 6, a diagram of trim piece 300 with panels in accordance with an embodiment is shown. In FIG. 6, a view looking toward a top or bottom of a trim piece may be depicted. In FIG. 6, the top of trim piece 300 may generally be a solid structure. To illustrate interior features such as fluid flow paths that may otherwise not be viewable from this view point, these structures are illustrated with dashed lines that would otherwise be obscured from view.

In an embodiment, trim piece 300 may also include panels (e.g., panel 420) to alter fluid flow paths while providing openings within extensions 330A, 330B to thermally manage components positioned in server chassis 110A.

In FIG. 6, gasses may generally flow through fluid flow paths 450, 480 from top to bottom or the reverse on the sheet. In contrast, in FIG. 5, gasses may generally flow into or out of the page through fluid flow paths 350.

Generally, server chassis opening frame 310 may have a different thickness from extensions 330A, 330B. The thickness of the respective portions of trim piece 300 may be set to facilitate attachment of extensions 330A, 330B to ears of a server chassis and attachment of server chassis opening frame 310 to other portions of a server chassis (e.g., such as a top or bottom edge).

While illustrated in FIG. 6 with respect to a limited number of specific components in specific positions and orientations, a trim piece may include different number and/or types of components with different positions and/or orientations without departing from embodiments disclosed herein.

Figure 7:
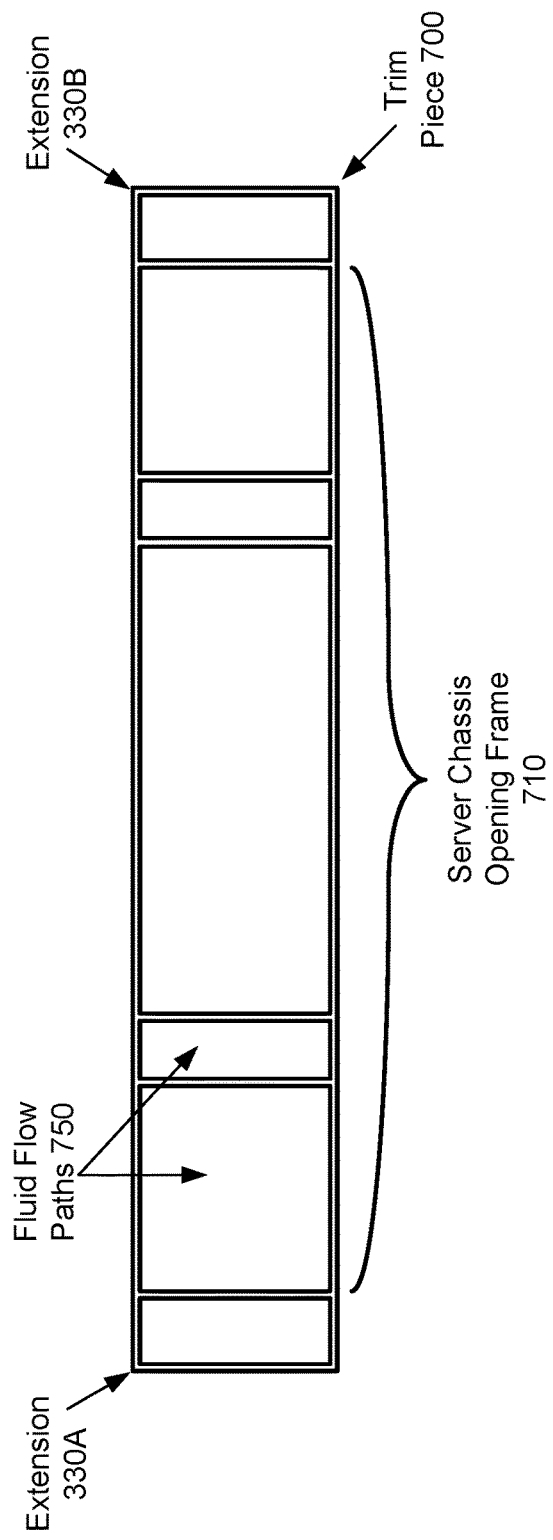
FIG. 7 is a diagram illustrating a trim piece in accordance with an embodiment.

Turning to FIG. 7, a diagram of trim piece 700 in accordance with an embodiment is shown. In FIG. 7, a view looking toward a front of a trim piece may be depicted. Gasses may generally flow into or out of the page through fluid flow paths 750.

In an embodiment, trim piece 700 may include openings within extensions 330A, 330B to thermally manage components positioned in server chassis 110A. To thermally manage the components, various fluid flow paths may correspond to positioning of to-be-thermally-managed components in a server chassis as well as airflow paths through server chassis. The sizes and shapes of fluid flow paths 750 may be set based on the positioning of these components and fluid flow paths. Consequently, trim pieces for use with different server chassis (that may include different component positions therein) may include fluid flow paths 750 with different structures.

For example, in contrast to the diagram shown in FIG. 5, the trim piece illustrated in FIG. 7 includes fluid flow paths 750 which are different in number, position, and cross section than fluid flow paths 350 shown in FIG. 5. The characteristics of the fluid flow paths of each trim piece may be set, for example, on the basis of where stacks of devices will be positioned in a server chassis when the trim piece is attached to the server chassis.

In an embodiment, fluid flow paths of a trim piece are divided into two categories: (i) fluid flow paths for devices stacks that will be positioned near the trim piece and (ii) fluid flow paths for devices that will be positioned away from the trim piece. The fluid flow paths for the devices that will be positioned near the trim pieces may generally have larger cross sections while the fluid flow paths for the devices that will be positioned away from the trim piece may generally have smaller cross sections. For example, the fluid flow paths for the devices that will be positioned away from the trim piece may be positioned with respect to channels to the devices whereas the fluid flow paths for the devices that will be positioned near the trim pieces may be positioned adjacent to the devices.

Generally, server chassis opening frame 710 may have a different thickness from extensions 330A, 330B. For example, with reference to FIG. 6, server chassis opening frame thickness 310C may be smaller than extension thickness 330C. The thickness of the respective portions of trim piece 700 may be set to facilitate attachment of extensions 330A, 330B to ears of a server chassis and attachment of server chassis opening frame 710 other portions of a server chassis (e.g., such as a top or bottom edge). While attached to a server chassis, trim piece 700 may cause a server chassis to be less susceptible to structural divergence from nominal specifications due to, for example, loading.

While illustrated in FIG. 7 with respect to a limited number of specific components in specific positions and orientations, a trim piece may include different number and/or types of components with different positions and/or orientations without departing from embodiments disclosed herein.

Figure 8:
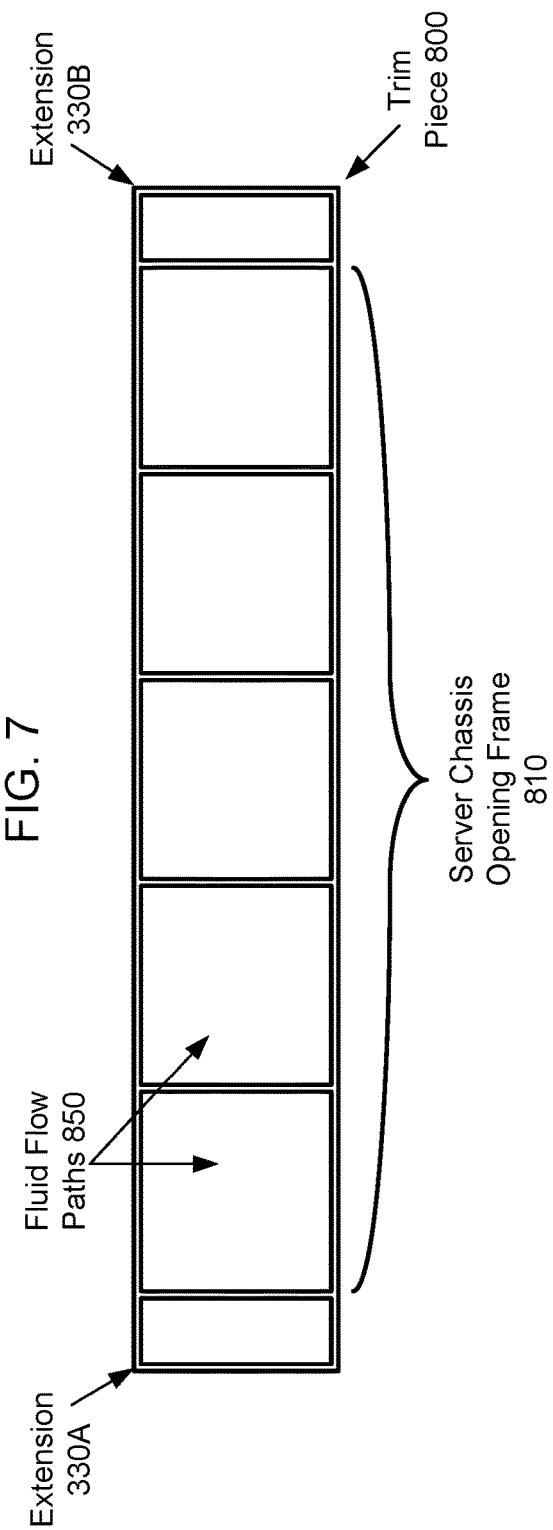
FIG. 8 is a diagram illustrating a trim piece in accordance with an embodiment.

Turning to FIG. 8, a diagram of trim piece 800 in accordance with an embodiment is shown. In FIG. 8, a view looking toward a front of a trim piece may be depicted. Gasses may generally flow into or out of the page through fluid flow paths 850.

In an embodiment, trim piece 800 may include openings within extensions 330A, 330B to thermally manage components positioned in server chassis 110A. To thermally manage the components, various fluid flow paths may correspond to positioning of to-be-thermally-managed components in a server chassis as well as airflow paths through server chassis. The sizes and shapes of fluid flow paths 850 may be set based on the positioning of these components and fluid flow paths. Consequently, trim pieces for use with different server chassis (that may include different component positions therein) may include fluid flow paths 850 with different structures.

In contrast to the trim pieces illustrated in FIGS. 6 and 7, fluid flow paths 850 shown in FIG. 8 may generally correspond to devices that will be positioned proximate to the trim piece. For example, each of fluid flow paths 850 may include large cross sections which may be positioned and oriented to provide for the thermal management of corresponding device stacks.

Generally, server chassis opening frame 810 may have a different thickness from extensions 330A, 330B. The thickness of the respective portions of trim piece 800 may be set to facilitate attachment of extensions 330A, 330B to ears of a server chassis and attachment of server chassis opening frame 810 other portions of a server chassis (e.g., such as a top or bottom edge). While attached to a server chassis, trim piece 800 may cause a server chassis to be less susceptible to structural divergence from nominal specifications due to, for example, loading.

While illustrated in FIG. 8 with respect to a limited number of specific components in specific positions and orientations, a trim piece may include different number and/or types of components with different positions and/or orientations without departing from embodiments disclosed herein.

Thus, as seen in FIGS. 4-8, various trim pieces may have features corresponding to the devices that may be housed in server chassis. Accordingly, when integrated into an electronic rack, different server chassis may be used in combination with different trim pieces to provide for the customized thermal, security, and electromagnetic inference management of devices housed in respective chassis.

Figure 9:
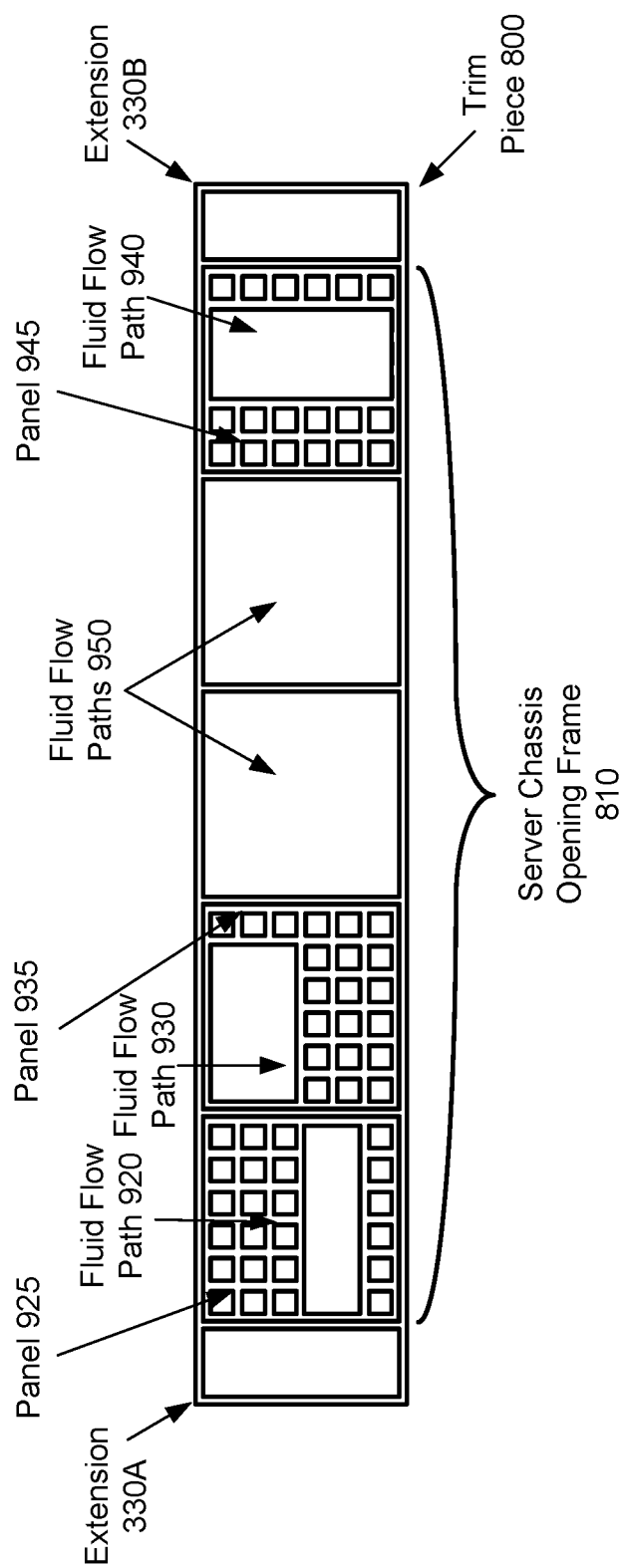
FIG. 9 is a diagram illustrating a trim piece with panels in accordance with an embodiment.

Turning to FIG. 9, a diagram of trim piece 800 in accordance with an embodiment is shown. In FIG. 9, a view looking toward a front of a trim piece may be depicted. Gasses may generally flow into or out of the page through fluid flow paths 920, 930, 940, 950.

In an embodiment, trim piece 800 may include panels (e.g., panels 925, 935, 945) to alter fluid flow paths to thermally, physically, and/or electromagnetically manage components positioned in server chassis 110A.

In an embodiment, trim piece 800 may also include openings within extensions 330A, 330B to thermally manage components positioned in server chassis 110A. To thermally manage the components, various fluid flow paths may correspond to positioning of to-be-thermally-managed components in a server chassis as well as airflow paths through server chassis. The sizes and shapes of fluid flow paths 920, 930, 940, 950 may be set based on the positioning of these components and fluid flow paths. Consequently, trim pieces for use with different server chassis (that may include different component positions therein) may include fluid flow paths 920, 930, 940, 950 with different structures.

Generally, server chassis opening frame 810 may have a different thickness from extensions 330A, 330B. The thickness of the respective portions of trim piece 800 may be set to facilitate attachment of extensions 330A, 330B to ears of a server chassis and attachment of server chassis opening frame 810 other portions of a server chassis (e.g., such as a top or bottom edge). While attached to a server chassis, trim piece 800 may cause a server chassis to be less susceptible to structural divergence from nominal specifications due to, for example, loading.

Panels 925, 935, 945 may include a body (e.g., including an aluminum sheet metal, metal coated plastic materials, etc.) and openings through the body. Panels 925, 935, 945 may be adapted to restrict transmission of electromagnetic radiation through fluid flow paths 920, 930, 940 respectively while allowing gasses to flow through fluid flow paths 920, 930, 940 to thermally manage components positioned in server chassis 110A. Such restrictions on the transmission of electromagnetic radiation may be based on panels 925, 935, 945 thicknesses and openings through the body of panels 925, 935, 945 as further discussed below.

Panels 925, 935, 945 may include a conductive material. This conductive material and openings through the body of panels 925, 935, 945 may form an electromagnetic interference screen. This may be accomplished by designing the openings in the body of panels 925, 935, 945 to have cross sectional shapes and sizes that form sub-wavelength apertures for a portion of the electromagnetic radiation that has a spectral content below a predetermined frequency. The sub-wavelength apertures may then reflect the portion of the electromagnetic radiation that is incident on panels 925, 935, 945.

Panels 925, 935, 945 may correspond to fluid flow paths 920, 930, 940 respectively. Panels 925, 935, 945 may include openings that allow gasses to flow through fluid flow paths 920, 930, 940 respectively while the panels are positioned in fluid flow paths 920, 930, 940 and trim piece 800 is attached to server chassis 110A. Trim piece 800 may further include additional openings that allow gasses to flow through fluid flow paths 950 while no panel is positioned in fluid flow paths 950. In doing so, panels 925, 935, 945 may present an impedance to the flow of gasses through fluid flow paths 920, 930, 940 respectively while panels 925, 935, 945 are positioned in fluid flow paths 920, 930, 940. Similarly, not having a panel (or having panels with different opening patterns) may present a different impedance to the flow of gasses through fluid flow paths 950 while no panel is positioned in fluid flow paths 950. By arranging trim piece 800 in this manner, the resulting different impedances may preferentially flow the gasses through fluid flow paths 950 or fluid flow paths 920, 930, 940 to thermally manage components positioned in server chassis 110A.

Panels 925, 935, 945 may also be adapted to manage physical access to server chassis 110A through fluid flow paths 920, 930, 940 respectively. Server chassis opening frame 810 may include panel retention mechanisms (not shown) positioned in openings of server chassis opening frame 810. The panel retention mechanisms may prevent, while panels 925, 935, 945 are positioned in fluid flow paths 920, 930, 940 respectively, removal of panels 925, 935, 945 from an opening in server chassis opening frame 810. Conversely, the panel retention mechanism may allow, while panels 925, 935, 945 are positioned in fluid flow paths 920, 930, 940 respectively, removal of panels 925, 935, 945 from an opening in server chassis opening frame 810 by reversibly interlocking panels 925, 935, 945 to a portion of server chassis opening frame 810 that circumscribes an opening.

The respective panels may include different opening patterns to allow for different types of physical access through the corresponding fluid flow paths. For example, some panels may have an opening pattern that allows for partial access to portions of devices positioned proximate to a fluid flow path (e.g., near a front of a server chassis). In contrast, other panels may have an opening pattern that does not allow for partial access to the devices positioned proximate to the fluid flow paths.

While illustrated in FIG. 9 with respect to a limited number of specific components in specific positions and orientations, a trim piece may include different number and/or types of components with different positions and/or orientations without departing from embodiments disclosed herein.

Figure 10:
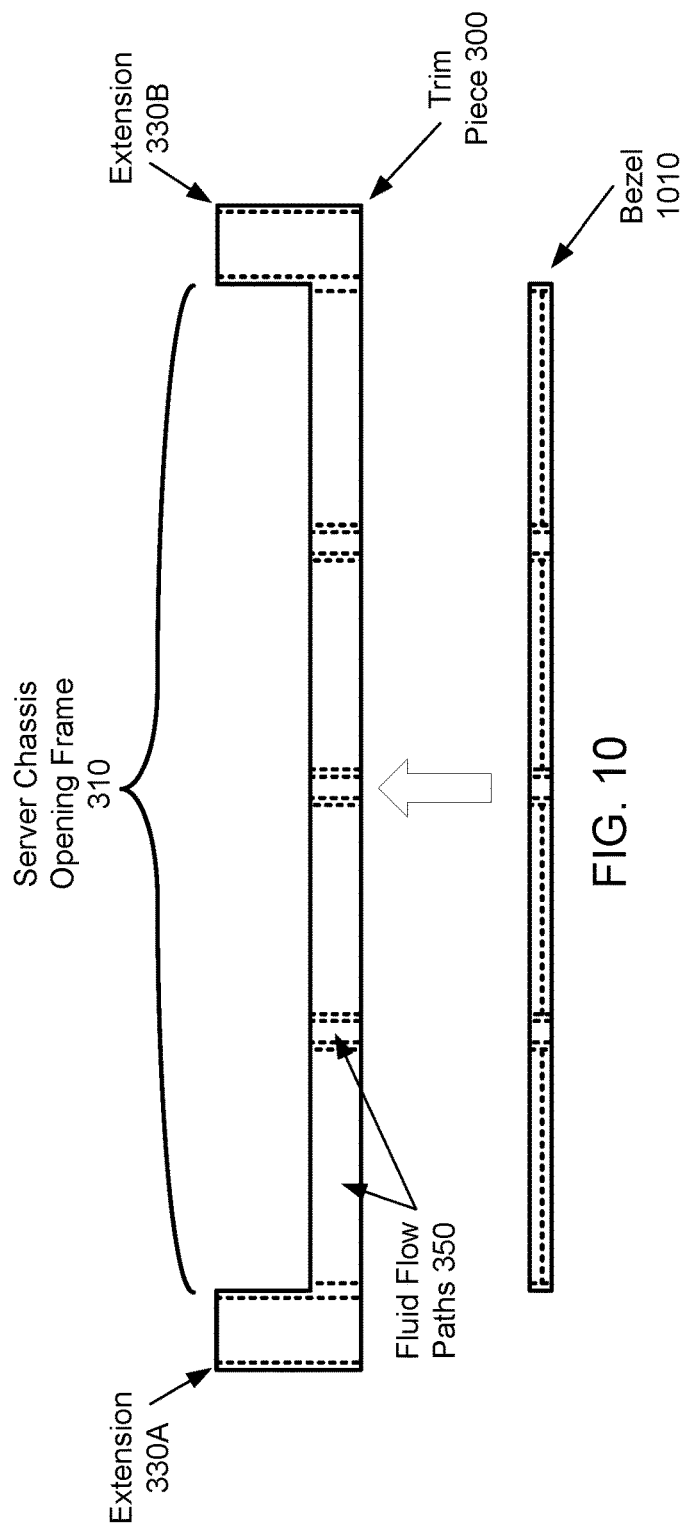
FIG. 10 is a diagram illustrating a trim piece and a bezel in accordance with an embodiment.

Turning to FIG. 10, a diagram of trim piece 300 and bezel 1010 in accordance with an embodiment is shown. In FIG. 10, a view looking toward a top or bottom of a trim piece and a bezel may be depicted in which gasses may generally flow through fluid flow paths 350 from top to bottom or the reverse on the sheet. In FIG. 10, the tops of trim piece 300 and bezel 1010 may generally be a solid structure. To illustrate interior features such as fluid flow paths that may otherwise not be viewable from this view point, these structures are illustrated with dashed lines that would otherwise be obscured from view.

Figure 11:
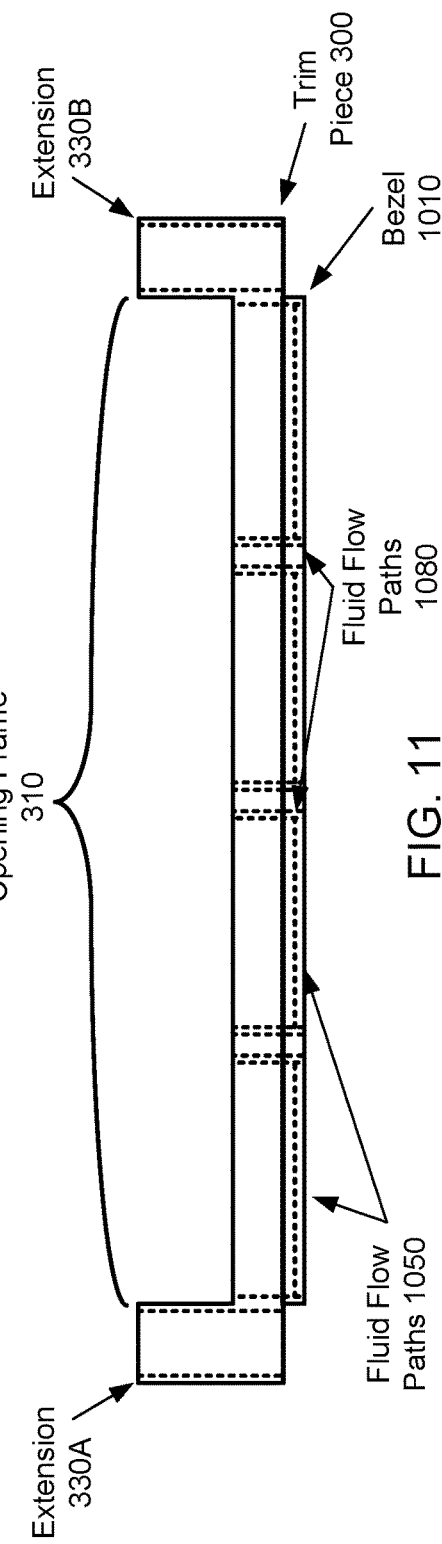
FIG. 11 is a diagram illustrating a bezel attached to a trim piece in accordance with an embodiment.

In an embodiment, bezel 1010 may include panels to alter fluid flow paths when mated to trim piece 300, as further described in FIG. 11 (in contrast to the figures previously shown where the panels are integrated with the server chassis opening frames) while trim piece 300 may provide openings within extensions 330A, 330B to thermally manage components positioned in server chassis 110A.

Bezel 1010 may be reversibly mated to server chassis opening frame 310 and/or extensions 330A, 330B. When so mated, openings through bezel may be aligned with the fluid flow paths through server chassis opening frame 310 and/or extensions 330A, 330B. In this manner, the fluid flow features of server chassis opening frame 310 and/or extensions 330A, 330B may be maintained while allow for use of bezels as part of trim piece 300. Bezel 1010 may be mated with server chassis opening frame 310 and/or extensions 330A, 330B using, for example, interlocking mechanisms, bolts, screws, pins, and/or other mechanical interlocking features. When so interlocked, bezel 1010 may be automatically aligned with server chassis opening frame 310 and/or extensions 330A, 330B.

While illustrated in FIG. 10 with respect to a limited number of specific components in specific positions and orientations, a trim piece may include different number and/or types of components with different positions and/or orientations without departing from embodiments disclosed herein.

Turning to FIG. 11, a diagram of trim piece 300 with bezel 1010 mated to trim piece 300 in accordance with an embodiment is shown. In FIG. 11, a view looking toward a top or bottom of a trim piece and bezel may be depicted in which gasses may generally flow through fluid flow paths 1050, 1080 from top to bottom or the reverse on the sheet. In FIG. 11, the tops of trim piece 300 and bezel 1010 may generally be a solid structure. To illustrate interior features such as fluid flow paths that may otherwise not be viewable from this view point, these structures are illustrated with dashed lines that would otherwise be obscured from view.

Generally, server chassis opening frame 310 may have a different thickness from extensions 330A, 330B. The thickness of the respective portions of trim piece 300 may be set to facilitate attachment of extensions 330A, 330B to ears of a server chassis and attachment of server chassis opening frame 310 to other portions of a server chassis (e.g., such as a top or bottom edge). The thickness of the respective portions of trim piece 300 may also be set to facilitate attachment of bezel 1010 to extensions 330A, 330B.

Bezel 1010 may include a body (e.g., aluminum sheet metal, metal coated plastic materials, etc.) and openings through the body. Bezel 1010 may include and/or use attachment members (not shown) to reversibly attach bezel 1010 to extensions 330A, 330B of trim piece 300. While attached to the pair of extensions 330A, 330B of trim piece 300, the openings of bezel 1010 may be aligned with fluid flow paths 350. Attachment members may also provide for transmission of forces from trim piece 300 to bezel 1010, thereby further structurally reinforcing server chassis 110A and reducing its susceptibility to structural divergence due to loading.

Figure 12:
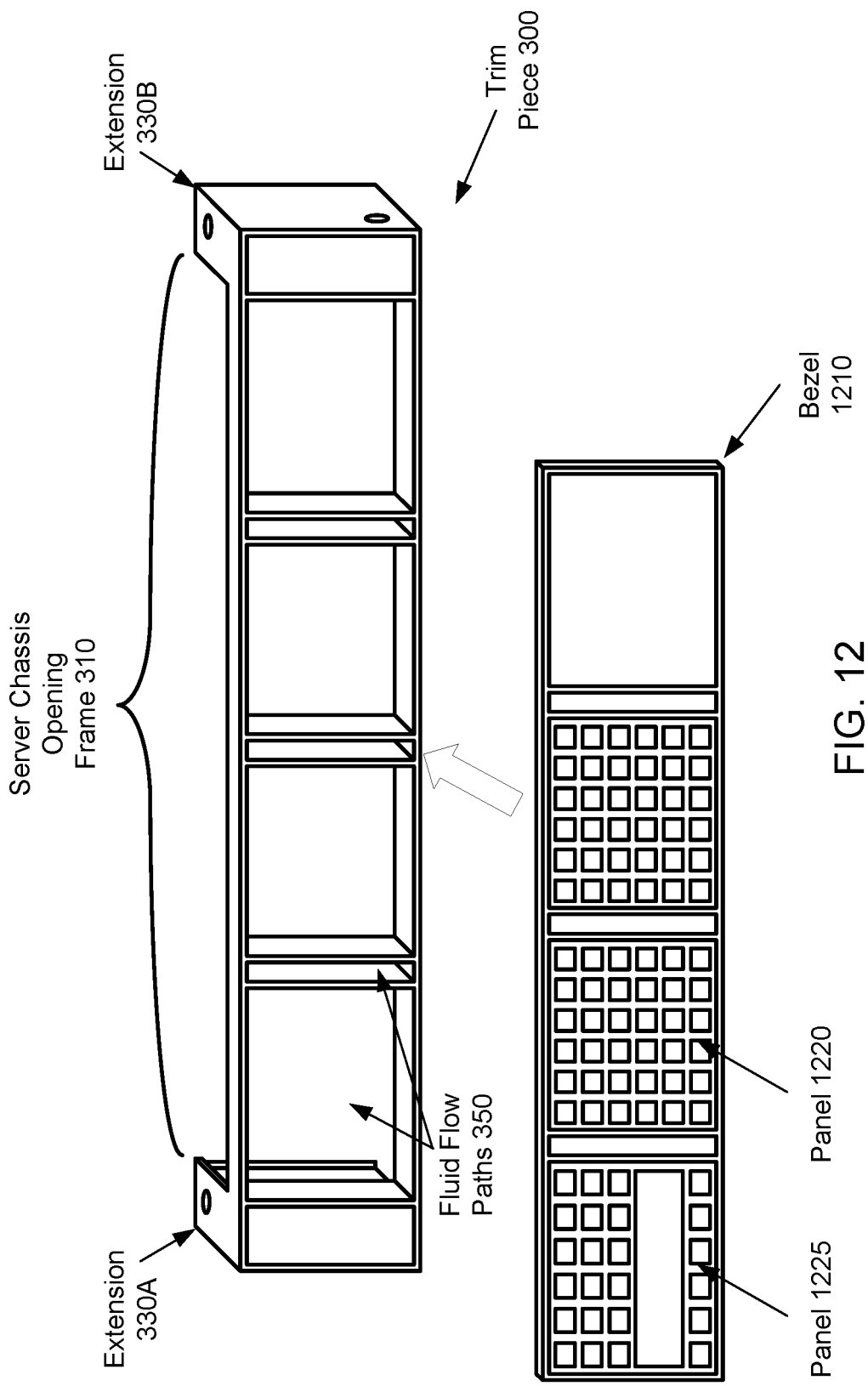
FIG. 12 is a diagram illustrating a trim piece and a bezel in accordance with an embodiment.

Bezel 1010 may be adapted to manage physical access to server chassis 110A through fluid flow paths 1050. Bezel 1010 may include a panel retention mechanism (not shown) positioned in an opening of bezel 1010. In an embodiment, the panel retention mechanism may be adapted to reversibly interlock with a panel (e.g., panels 1220, 1225 as shown in FIG. 12) positioned in fluid flow paths 1050 while the panel is interlocked with the panel retention mechanism and bezel 1010 is attached to pair of extensions 330A, 330B of trim piece 300. The panel retention mechanism may prevent, while panels are positioned in fluid flow path 1050, removal of panels from an opening in bezel 1010. Conversely, the panel retention mechanism may allow, while panels are positioned in fluid flow path 1050, removal of panels from an opening in bezel 1010 by reversibly interlocking panels to a portion of bezel 1010 that circumscribes an opening.

Bezel 1010 may also be adapted to restrict transmission of electromagnetic radiation through fluid flow paths 350 while allowing gasses to flow through fluid flow paths 1050, 1080 to thermally manage components positioned in server chassis 110A. Such restrictions on the transmission of electromagnetic radiation may be based on bezel 1010 panel thicknesses and openings through the body of bezel 1010 as further discussed below.

Bezel 1010 and panels (e.g., panels 1220, 1225 as shown in FIG. 12) may include conductive materials. These conductive materials and openings through the body of bezel 1010 and panels may form an electromagnetic interference screen. This may be accomplished by designing panels within the openings in the body of bezel 1010 to have cross sectional shapes and sizes that form sub-wavelength apertures for a portion of the electromagnetic radiation that has a spectral content below a predetermined frequency. The sub-wavelength apertures may then reflect the portion of the electromagnetic radiation that is incident on the panels within the openings in the body of bezel 1010.

Bezel 1010 may correspond to fluid flow paths 1050, 1080. Bezel 1010 may include panels with openings that allow gasses to flow through fluid flow paths 1050, 1080 while bezel 1010 is reversibly attached to trim piece 300 that is attached to server chassis 110A. Trim piece 300 may further include additional openings (e.g., openings within extensions 330A, 330B) that allow gasses to flow through fluid flow paths while bezel 1010 is positioned on server chassis opening frame 310. In doing so, bezel 1010 may present an impedance to the flow of gasses through fluid flow paths 1050 while bezel 1010 is attached to extensions 330A, 330B. Similarly, not having bezel 1010 attached to extensions 330A, 330B may present a different impedance to the flow of gasses through fluid flow paths 350 as illustrated in FIG. 10. By arranging trim piece 300 in this manner, the resulting different impedances may preferentially flow the gasses through fluid flow paths 1050, 1080 or fluid flow paths 350 to thermally manage components positioned in server chassis 110A.

While illustrated in FIG. 11 with respect to a limited number of specific components in specific positions and orientations, a trim piece may include different number and/or types of components with different positions and/or orientations without departing from embodiments disclosed herein.

Turning to FIG. 12, a diagram of trim piece 300 and bezel 1210 in accordance with an embodiment is shown. In FIG. 12, an isometric view of a trim piece and a bezel may be depicted.

In an embodiment, bezel 1210 may include panels (e.g., panels 1220, 1225) to alter fluid flow paths while providing an opening without a panel to thermally manage components positioned in server chassis 110A when bezel 1210 is reversibly attached to extensions 330A, 330B.

While illustrated in FIG. 12 with respect to a limited number of specific components in specific positions and orientations, a trim piece may include different number and/or types of components with different positions and/or orientations without departing from embodiments disclosed herein.

Figure 13:
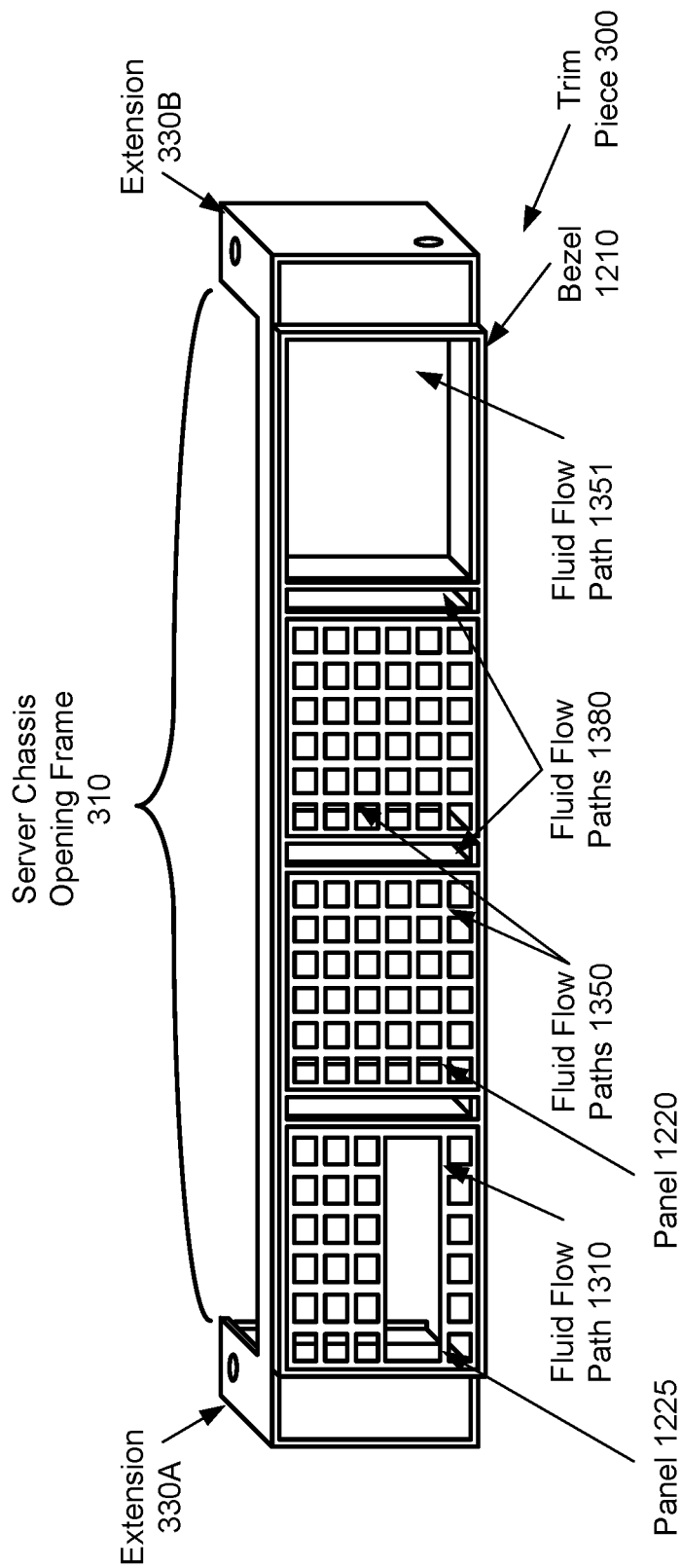
FIG. 13 is a diagram illustrating a bezel attached to a trim piece in accordance with an embodiment.

Turning to FIG. 13, a diagram of trim piece 300 with bezel 1210 mated to trim piece 300 in accordance with an embodiment is shown. In FIG. 13, an isometric view of a bezel mated to a trim piece may be depicted.

Generally, server chassis opening frame 310 may have a different thickness from extensions 330A, 330B. The thickness of the respective portions of trim piece 300 may be set to facilitate attachment of extensions 330A, 330B to ears of a server chassis and attachment of server chassis opening frame 310 to other portions of a server chassis (e.g., such as a top or bottom edge). The thickness of the respective portions of trim piece 300 may also be set to facilitate attachment of bezel 1210 to extensions 330A, 330B.

Bezel 1210 may include a body (e.g., aluminum sheet metal, metal coated plastic materials, etc.) and openings through the body. Bezel 1210 may include and/or use attachment members (not shown) to reversibly attach bezel 1210 to extensions 330A, 330B of trim piece 300. While attached to the pair of extensions 330A, 330B of trim piece 300, bezel 1010 may have openings aligned with the openings of server chassis opening frame 310. Attachment members may also provide for transmission of forces from trim piece 300 to bezel 1210, thereby structurally reinforcing server chassis 110A and reducing its susceptibility to structural divergence due to loading.

Bezel 1210 may also be adapted to manage physical access to server chassis 110A through fluid flow paths 1310, 1350, 1351. Bezel 1210 may include a panel retention mechanism (not shown) positioned in an opening of bezel 1210. In an embodiment, the panel retention mechanism may be adapted to reversibly interlock with a panel (e.g., panels 1220, 1225) positioned in fluid flow paths 1310, 13050 while the panel is interlocked with the panel retention mechanism and bezel 1210 is attached to pair of extensions 330A, 330B of trim piece 300. The panel retention mechanism may prevent, while panels 1220, 1225 are positioned in fluid flow paths 1310, 1350 respectively, removal of panels from an opening in bezel 1210. Conversely, the panel retention mechanism may allow, while panels 1220, 1225 are positioned in fluid flow paths 1310, 1350 respectively, removal of panels from an opening in bezel 1210 by reversibly interlocking panels 1220, 1225 to a portion of bezel 1210 that circumscribes an opening.

Bezel 1210 may be adapted to restrict transmission of electromagnetic radiation through fluid flow paths 1310, 1350 while allowing gasses to flow through fluid flow paths 1310, 1350, 1351, 1380 to thermally manage components positioned in server chassis 110A. Such restrictions on the transmission of electromagnetic radiation may be based on bezel 1210 thickness and openings through the body of bezel 1210 as further discussed below.

Bezel 1210 and panels 1220, 1225 may include conductive materials. These conductive materials and openings through the body of bezel 1210 and panels 1220, 1225 may form an electromagnetic interference screen. This may be accomplished by designing panels 1220, 1225 within the openings in the body of bezel 1210 to have cross sectional shapes and sizes that form sub-wavelength apertures for a portion of the electromagnetic radiation that has a spectral content below a predetermined frequency. The sub-wavelength apertures may then reflect the portion of the electromagnetic radiation that is incident on panels 1220, 1225 within the openings in the body of bezel 1210.

Bezel 1210 may correspond to fluid flow paths 1310, 1350, 1351, 1380. Bezel 1210 may include panels 1220, 1225 with openings that allow gasses to flow through fluid flow paths 1310, 1350 while bezel 1210 is reversibly attached to trim piece 300 that is attached to server chassis 110A. Trim piece 300 may further include additional openings (e.g., openings within extensions 330A, 330B not shown) that allow gasses to flow through fluid flow paths while bezel 1210 is attached to extensions 330A, 330B. In doing so, bezel 1210 may present an impedance to the flow of gasses through fluid flow paths 1310, 1350 while bezel 1210 is attached to extensions 330A, 330B. Similarly, by not having a panel, bezel 1210 may present a different impedance to the flow of gasses through fluid flow paths 1351, 1380. By arranging bezel 1210 attached to trim piece 300 in this manner, the resulting different impedances may preferentially flow the gasses through fluid flow paths 1351, 1380 or fluid flow paths 1310, 1350 to thermally manage components positioned in server chassis 110A.

While illustrated in FIG. 13 with respect to a limited number of specific components in specific positions and orientations, a trim piece may include different number and/or types of components with different positions and/or orientations without departing from embodiments disclosed herein.

Turning to FIG. 14, a diagram of trim piece 300 and server chassis 110A in accordance with an embodiment is shown. In FIG. 14, an isometric view of receivers 211 on server chassis 110A and attachment members 1410 on trim piece 300 may be depicted.

Any number of receivers 211 may be positioned with top portion 111 and bottom portion 112 of server chassis 110A, as shown in FIG. 2. Any number of attachment members 1410 may be positioned on trim piece 300. Receivers 211 may provide for transmission of forces from server chassis 110A to trim piece 300, thereby structurally reinforcing server chassis 110A and reducing its susceptibility to structural divergence due to loading.

In an embodiment, receivers 211 are positioned with top edge 113 of top portion 111 and/or bottom edge 114 of bottom portion 112. These positions may allow for the dimension of server chassis to be better maintained by, for example, improving the planarity of top portion 111 and/or bottom portion 112, maintaining a spacing between top portion 111 and/or bottom portion 112, reducing warping of top portion 111 and/or bottom portion 112, and/or maintaining spacing between ears 230A, 230B and side portions 115.

Attachment members 1410 may be adapted to reversibly attach to receivers 211 of server chassis 110A with a movement of trim piece 300 toward server chassis 110A while outer profile 210 of server chassis opening frame 310 is aligned with outer profile 210 of opening 205 in front of server chassis 110A. Attachment members 1410 may be disjointed from receivers 211 by translating trim piece 300 away from server chassis 110A. Attachment members 1410 may not be disjointed from receivers 211 by translating trim piece 300 along outer profile 210 of server chassis 110A. Attachment members 1410 may also not be disjointed from receivers 211 by translating trim piece 300 vertically with respect to server chassis 110A when attachment members 1410 are engaged with receivers 211 at top edge 113 of top portion 111 and bottom edge 114 of bottom portion 112 of server chassis 110A.

While illustrated in FIG. 14 with respect to a limited number of specific components in specific positions and orientations, a trim piece and a server chassis may include different number and/or types of components with different positions and/or orientations without departing from embodiments disclosed herein.

Figure 15:
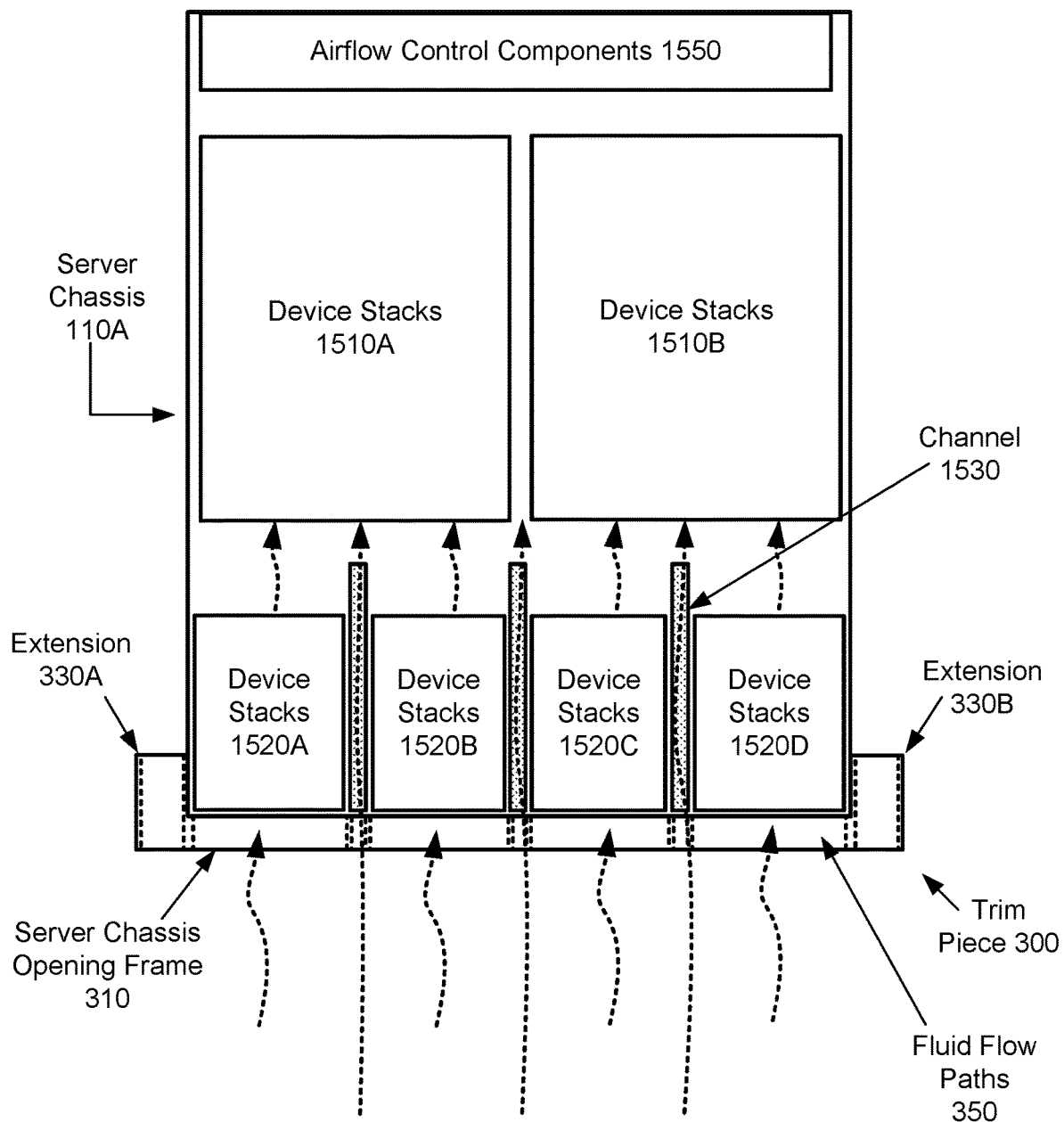
FIG. 15 is a diagram illustrating a trim piece attached to a server chassis in accordance with an embodiment.
Figure 16:
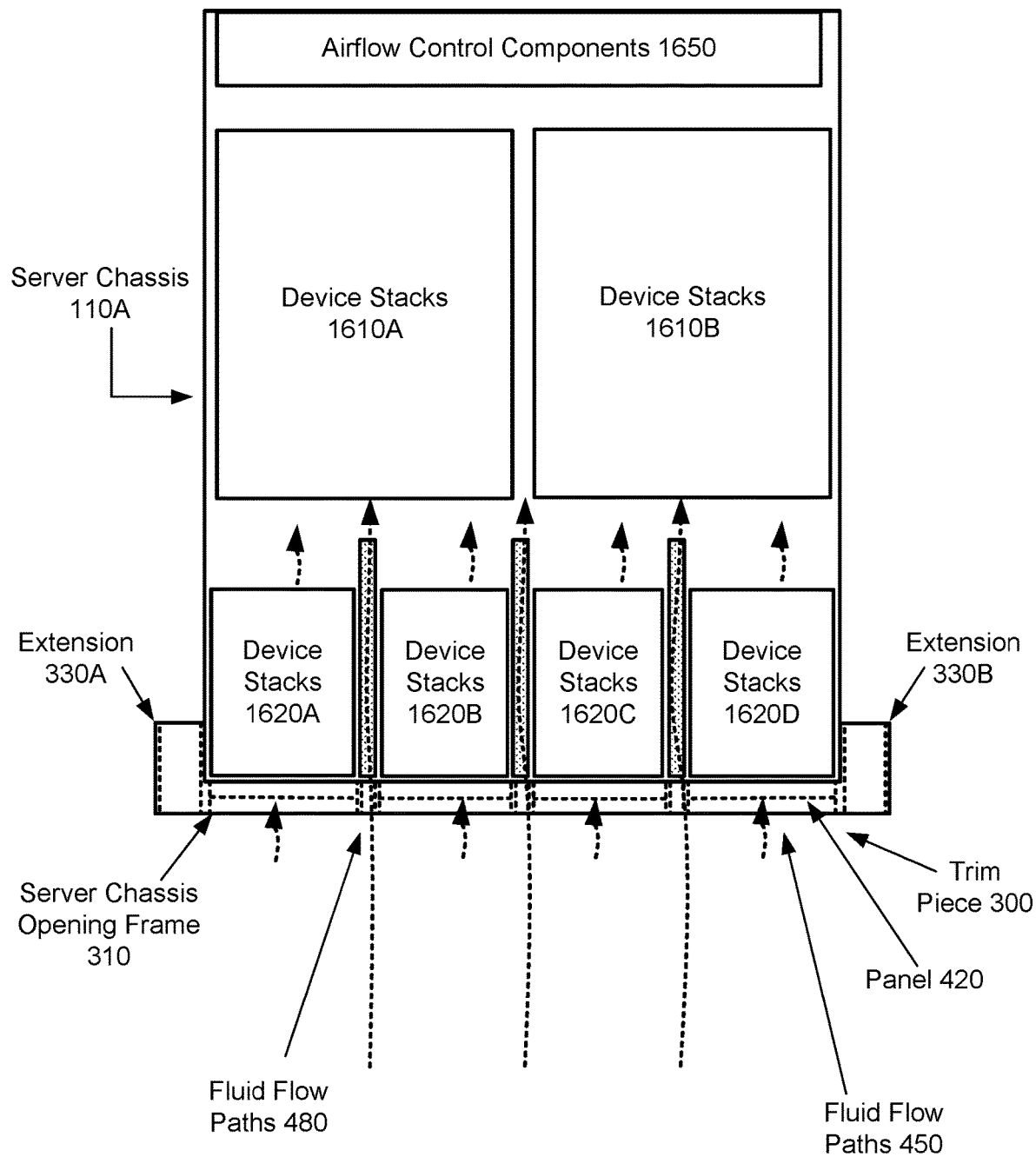
FIG. 16 is a diagram illustrating a trim piece with panels and the trim piece with panels attached to a server chassis in accordance with an embodiment.

Turning to FIG. 15, a diagram illustrating trim piece 300 attached to server chassis 110A with device stacks 1510A, 1510B, 1520A, 1520B, 1520C, 1520D, and airflow control components 1550 positioned within server chassis 110A in accordance with an embodiment is shown. While attached to server chassis 110A, trim piece 300 may provide for an airflow through trim piece 300 into and/or out of server chassis 110A through fluid flow paths 350 to reach device stacks 1510A, 1510B, 1520A, 1520B, 1520C, 1520D, and airflow control components 1550. In FIG. 15, a view looking toward a top or bottom of a trim piece and a server chassis may be depicted in which gasses may generally flow through fluid flow paths 350 from top to bottom or the reverse on the sheet. In FIGS. 15 and 16, airflows are illustrated with short dashed lines terminating in arrows.

In an embodiment, device stacks 1510A, 1510B, 1520A, 1520B, 1520C, 1520D may vary in size and number, with any device in any of the device stacks varying in shape, performance, and functionality. Airflow control components 1550 may also vary in size and number in server chassis 110A, with any of the airflow control components varying in shape, performance, and functionality relating to airflow control.

In an embodiment, one or more device stacks 1510A, 1510B, 1520A, 1520B, 1520C, 1520D include one or more of the following types of components: (i) memory modules such as random access memory (RAM), (ii) processing devices such as a central processing unit (CPU), (iii) storage devices such as hard disk drives, solid state drives, etc.; and (iv) input and output (I/O) devices. The device stacks may include different types of devices without departing from embodiments disclosed herein.

Generally, devices stacks may be divided into groups with respect to their positions relative to a front of server chassis 110A. For the devices stacks grouped based on being positioned away from a front of server chassis 110A, one or more of channel 1530 may be interspersed with device stacks positioned near the front of server chassis 110A. The one or more of channel 1530 may allow for gasses to flow to the components positioned away from the front of the chassis without interacting with the devices positioned near the front of server chassis 110A. In this manner, devices positioned away from the front of server chassis 110A may be thermally managed, at least in part, with a flow of gas that has not been heated by virtue of interaction with other devices positioned near a front of server chassis 110A. As will be seen with respect to FIG. 16, in an embodiment, panels are positioned with respect to fluid flow paths 350 to manage the rates of flow of gasses through these openings so that the respective groups of devices stacks are provided with appropriate cooling. For example, panels may be positioned with fluid flow paths corresponding to device stacks that are near a front (or side through which gas flow for thermal management is received) such that the fluid flow impedance of these fluid flow paths is raised with respect to other fluid flow paths that allow for gasses to flow through one or more of channel 1530.

In an embodiment, one or more airflow control components 1550 include one or more of the following types of components: (i) an air modulator (e.g., a fan), (ii) an air temperature sensor, (iii) an air refrigeration device, and (iv) a computing device. The airflow control components may include different types of components without departing from embodiments disclosed herein.

In an embodiment, one or more airflow control components (e.g., air modulator, computing device, etc.) are located within electronic rack 100 in addition to being located within server chassis 110A. The airflow control components within electronic rack 100 may include different types of components without departing from embodiments disclosed herein.

Server chassis opening frame 310 may include all, or a portion, of fluid flow paths 350, which may extend through server chassis opening frame 310. Any of fluid flow paths 350 may include an opening having a cross section of substantially rectangular shape. Fluid flow paths 350 may also include additional openings having cross sections of substantially rectangular shape. Further, server chassis opening frame 310 may include and/or use divider walls to separate various openings having a cross section of substantially rectangular shape from other openings in trim piece 300. Server chassis opening frame 310 may also include additional divider walls to separate openings of fluid flow paths 350 from extensions 330A, 330B, as discussed in further detail below.

In an embodiment, extensions 330A, 330B are physical structures for attaching trim piece 300 to server chassis 110A and reinforcing server chassis 110A when so attached.

In an embodiment, extensions 330A, 330B are adapted to reversibly attach to corresponding ears 230A, 230B located on server chassis 110A as shown in FIG. 2. Extensions 330A, 330B may also be adapted to reversibly attach to corresponding extension blocks 235A, 235B located on server chassis 110A. Each of extensions 330A, 330B of server chassis opening frame 310 may be positioned with opposite side portions 115 of server chassis 110A. Server chassis opening frame 310 and extensions 330A, 330B may cover a full outer profile of server chassis 110A while pair of extensions 330A, 330B are attached to server chassis 110A. The full outer profile of server chassis 110A may circumscribe an opening in the front of server chassis 110A through which an airflow may traverse through fluid flow paths 350 while server chassis opening frame 310 is attached to server chassis 110A in order to thermally manage device stacks 1510A, 1510B, 1520A, 1520B, 1520C, 1520D, and airflow control components 1550 positioned in server chassis 110A. In addition to airflow, server chassis opening frame 310 may also provide for access to device stacks 1510A, 1510B, 1520A, 1520B, 1520C, 1520D, and airflow control components 1550 within server chassis 110A while trim piece 300 is attached to server chassis 110A.

Trim piece 300 may be manufactured with a conductive material (and/or other materials). The conductivity, shape, and other characteristics of the conductive material may limit electromagnetic radiation propagation to or from device stacks 1510A, 1510B, 1520A, 1520B, 1520C, 1520D and airflow control components 1550. For example, the conductive material may reduce propagation of electromagnetic interference through extensions 330A, 330B. However, electromagnetic radiation may still, for example, propagate into and/or out of an interior of server chassis 110A through fluid flow paths 350 of server chassis opening frame 310. In an embodiment, the conductive material of trim piece 300 is aluminum. The conductive material may be other types of conductive materials without departing from embodiment disclosed herein. Trim piece 300 may also include non-conductive and/or other types of materials.

While illustrated in FIG. 15 with respect to a limited number of specific components in specific positions and orientations, a trim piece and a server chassis may include different number and/or types of components with different positions and/or orientations without departing from embodiments disclosed herein.

Turning to FIG. 16, a diagram illustrating trim piece 300 attached to server chassis 110A with device stacks 1610A, 1610B, 1620A, 1620B, 1620C, 1620D, and airflow control components 1650 located within server chassis 110A in accordance with an embodiment is shown. While attached to server chassis 110A, trim piece 300 may include one or more panels (e.g., panel 420) to alter fluid flow paths 350 into fluid flow paths 450, 480 to reach device stacks 1510A, 1510B, 1520A, 1520B, 1520C, 1520D, and airflow control components 1550. In FIG. 16, a view looking toward a top or bottom of a trim piece and a server chassis may be depicted in which gasses may generally flow through fluid flow paths 450, 480 from top to bottom or the reverse on the sheet.

Panel 420 may include a body (e.g., aluminum sheet metal, metal coated plastic materials, etc.) and openings through the body. Panel 420 may be adapted to restrict transmission of electromagnetic radiation through fluid flow paths 450 while allowing gasses to flow through fluid flow paths 450 to thermally manage device stacks 1510A, 1510B, 1520A, 1520B, 1520C, 1520D, and airflow control components 1550 positioned in server chassis 110A. Such restrictions on the transmission of electromagnetic radiation may be based on panel 420 thickness and openings through the body of panel 420 as further discussed below.

Panel 420 may include a conductive material. This conductive material and openings through the body of panel 420 may form an electromagnetic interference screen. This may be accomplished by designing the openings in the body of panel 420 to have cross sectional shapes and sizes that form sub-wavelength apertures for a portion of the electromagnetic radiation that has a spectral content below a predetermined frequency. The sub-wavelength apertures may then reflect the portion of the electromagnetic radiation that is incident on panel 420.

Panel 420 may correspond to fluid flow paths 450. Panel 420 may include openings that allow gasses to flow through fluid flow paths 450 while the panel is positioned in fluid flow paths 450 and trim piece 300 is attached to server chassis 110A. Trim piece 300 may further include additional openings that allow gasses to flow through fluid flow paths 480 while no panel is positioned in fluid flow path 480. In doing so, panel 420 may present an impedance to the flow of gasses through fluid flow paths 450 while panel 420 is positioned in fluid flow paths 450. Similarly, not having panel 420 may present a different impedance to the flow of gasses through fluid flow paths 480 while no panel 420 is positioned in fluid flow paths 480. By arranging trim piece 300 in this manner, the resulting different impedances may preferentially flow the gasses through fluid flow paths 450 or fluid flow paths 480 to thermally manage device stacks 1510A, 1510B, 1520A, 1520B, 1520C, 1520D, and airflow control components 1550 positioned in server chassis 110A

(e.g. greater airflow may reach hotter components 1610A, 1610B than cooler components 1620A, 1620B, 1620C, 1620D).

Panel 420 may also be adapted to manage physical access to server chassis 110A through fluid flow paths 450. Server chassis opening frame 310 may include a panel retention mechanism (not shown) positioned in an opening of server chassis opening frame 310. The panel retention mechanism may prevent, while panel 420 is positioned in fluid flow paths 450, removal of panel 420 from an opening in server chassis opening frame 310. Conversely, the panel retention mechanism may allow, while panel 420 is positioned in fluid flow paths 450, removal of panel 420 from an opening in server chassis opening frame 310 by reversibly interlocking panel 420 to a portion of server chassis opening frame 310 that circumscribes an opening.

While illustrated in FIG. 16 with respect to a limited number of specific components in specific positions and orientations, a trim piece and a server chassis may include different number and/or types of components with different positions and/or orientations without departing from embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A trim piece assembly for a server chassis, the trim piece assembly comprising:
   a server chassis opening frame adapted to:
      reversibly attach to a front of the server chassis; and
      structurally reinforce the server chassis while the server chassis opening frame is attached to the front of the server chassis;
   a pair of extensions adapted to reversibly attach to corresponding ears of the server chassis that protrude outward from opposite sides of the server chassis as protrusions on a body of the server chassis, each of the pair of extensions being positioned on opposite sides of the server chassis opening frame and covering each of the ears of the server chassis in a form-fitting manner, the server chassis opening frame and the pair of extensions covering a full outer profile of the server chassis while the pair of extensions are attached to the server chassis, the full outer profile of the server chassis circumscribing an opening in the front of the server chassis through which an airflow traverses to thermally manage components positioned in the server chassis;
   fluid flow paths through the server chassis opening frame to allow the airflow into the server chassis through the server chassis opening frame while the pair of extensions are attached to the ears of the server chassis; and
   a first panel positioned in a fluid flow path of the fluid flow paths, the first panel being adapted to manage physical access to the server chassis through the fluid flow path.

2. The trim piece assembly of claim 1, further comprising:
   attachment members positioned adjacent to the server chassis opening frame, the attachment members are adapted to, while the pair of extensions are attached to the corresponding ears of the server chassis, reversibly attach to portions of the server chassis that define an outer profile of the opening in the front of the server chassis to form first joints between the server chassis opening frame and the server chassis, while the first joints and the server chassis opening frame maintain a shape of the outer profile of the opening in the front of the server chassis by structurally reinforcing the server chassis.

3. The trim piece assembly of claim 2, wherein the attachment members are adapted to reversibly attach to the portions of the server chassis with a movement of the trim piece assembly toward the server chassis while an outer profile of the server chassis opening frame is aligned with the outer profile of the opening in the front of the server chassis, wherein the first joints do not restrict a second movement of the trim piece assembly away from the server chassis, the second movement disjointing the first joints.

4. The trim piece assembly of claim 3, wherein the pair of extensions are further adapted to, while attached to the corresponding ears of the server chassis, form second joints between the server chassis and the trim piece assembly, the second joints restricting all movement of the server chassis opening frame with respect to the server chassis.

5. The trim piece assembly of claim 1, wherein the fluid flow paths through the server chassis opening frame comprise:
   a first opening having a first cross section of substantially rectangular shape; and
   a second opening having a second cross section of substantially rectangular shape,
   wherein the server chassis opening frame comprises:
      first divider walls that separate the first opening from the second opening; and
      second divider walls that separate at least one of the first opening and the second opening from at least one of the pair of extensions.

6. The trim piece assembly of claim 5, wherein the server chassis opening frame further comprises:
   a panel retention mechanism positioned adjacent to the first opening, the panel retention mechanism adapted to:
      prevent, while the first panel is positioned in a first fluid flow path of the fluid flow paths, removal of the first panel from one opening of the first fluid flow path;
      allow, while the first panel is positioned in the first fluid flow path, removal of the first panel from another opening of the first fluid flow path, the openings of the fluid flow path being positioned on opposite sides of the server chassis opening frame; and
      reversibly interlock the first panel to a portion of the server chassis opening frame that circumscribes the first opening.

7. The trim piece assembly of claim 1, wherein the first panel comprises:
   first openings that allow gasses to flow through a first fluid flow path of the fluid flow paths while the first panel is positioned in the first fluid flow path,
   wherein the trim piece assembly further comprises a second panel, the second panel comprising:
      second openings that allow gasses to flow through a second fluid flow path of the fluid flow paths while the second panel is positioned in the second fluid flow path,
   wherein the first panel presents a first impedance to the flow of gasses through the first fluid flow path while the first panel is positioned in the first fluid flow path, the second panel presents a second impedance to the flow of gasses through the second fluid flow path while the second panel is positioned in the second fluid flow path, and the first impedance and the second impedance are different to preferentially flow the gasses through the first fluid flow path or the second fluid flow path.

8. The trim piece assembly of claim 1, wherein the first panel comprises:
   a body; and
   openings through the body,
   wherein the body and the openings through the body are adapted to restrict transmission of electromagnetic radiation through the fluid flow path while allowing gasses to flow through the fluid flow path.

9. The trim piece assembly of claim 8, wherein the body comprises an electromagnetic conductive material, the electromagnetic conductive material and the openings through the body forming an electromagnetic interference screen, the openings in the body having cross sectional shapes and sizes forming sub-wavelength apertures for a portion of the electromagnetic radiation having a spectral content below a predetermined frequency, the sub-wavelength apertures reflecting the portion of the electromagnetic radiation when the portion of the electromagnetic radiation is incident on the first panel.

10. The trim piece assembly of claim 1, wherein the first panel comprises:
    a body; and
    openings through the body, the openings comprising first openings having first cross sectional shapes and sizes adapted to, while the first panel is positioned in the fluid flow path, prevent physical access to a region proximate to a second side of the server chassis opening frame from a first side of the server chassis opening frame while the first panel is positioned in the fluid flow path.

11. The trim piece assembly of claim 10, wherein the openings comprise:
    second openings having second cross sectional shapes and second sizes adapted to, while the first panel is positioned in the fluid flow path, provide physical access to the region proximate to the second side of the server chassis opening frame from the first side of the server chassis opening frame while the first panel is positioned in the fluid flow path.

12. The trim piece assembly of claim 1, further comprising:
    a bezel comprising:
      a body;
      openings through the body; and
      a panel retention mechanism,
    wherein
      the bezel is adapted to reversibly attach to the pair of extensions,
      while attached to the pair of extensions, the openings are aligned with the fluid flow paths, and
      the panel retention mechanism is adapted to reversibly interlock with the first panel, the first panel being positioned in the fluid flow path while the first panel is interlocked with the first panel retention mechanism and the bezel is attached to the pair of extensions.

13. The trim piece assembly of claim 1,
    wherein the server chassis comprises:
      the opening through which the gasses flow to thermally manage the computing components positioned in the server chassis; and
      the ears, wherein the ears are a pair of ears positioned on opposite sides of the opening, and
    wherein the trim piece assembly is part of a computing device that comprises:
      the server chassis;
      the trim piece assembly;
      a first portion of the computing components being arranged in stacks positioned proximate to the opening, the stacks being separated from each other by channels; and
      a second portion of the computing components positioned away from the opening, the first portion being positioned between the second portion and the opening.

14. A computing device, comprising:
    a server chassis comprising:
      an opening through which gasses flow to thermally manage computing components positioned in the server chassis; and
      a pair of ears positioned on opposite sides of the opening; and
    a first portion of the computing components being arranged in stacks positioned proximate to the opening, the stacks being separated from each other by channels;
    a second portion of the computing components positioned away from the opening, the first portion being positioned between the second portion and the opening;
    a trim piece assembly, comprising:
      a server chassis opening frame adapted to:
        reversibly attach to a front of the server chassis; and
        structurally reinforce the server chassis while the server chassis opening frame is attached to the front of the server chassis;
      a pair of extensions adapted to reversibly attach to the pair of ears, each of the pair of extensions being positioned on opposite sides of the server chassis opening frame, the server chassis opening frame and the pair of extensions covering a full outer profile of the server chassis while the pair of extensions are attached to the server chassis, the full outer profile of the server chassis circumscribing the opening;
      fluid flow paths through the server chassis opening frame to allow an airflow through the server chassis via the server chassis opening frame while the pair of extensions are attached to the ears of the server chassis; and
      a first panel positioned in a fluid flow path of the fluid flow paths, the first panel being adapted to manage physical access to the server chassis through the fluid flow path.

15. The computing device of claim 14, wherein the fluid flow paths through the server chassis opening frame comprise:
    a first opening having a first cross section of substantially rectangular shape; and
    a second opening having a second cross section of substantially rectangular shape,
    wherein the server chassis opening frame comprises:
      first divider walls that separate the first opening from the second opening; and
      second divider walls that separate at least one of the first opening and the second opening from at least one of the pair of extensions,
    wherein the first divider walls and the second divider walls are positioned along fluid flow paths through which the airflow traverses to a first portion of the computing components being arranged in stacks positioned proximate to the server chassis opening, the stacks being separated from each other by channels, and a second portion of the computing components positioned away from the server chassis opening, the first portion being positioned between the second portion and the server chassis opening.

16. The computing device of claim 15, wherein the first panel comprises:
   a body; and
   first openings through the body, the first openings having first cross sectional shapes and sizes adapted to, while the first panel is positioned in the fluid flow path, prevent physical access to a region proximate to a second side of the server chassis opening frame from a first side of the server chassis opening frame while the first panel is positioned in the fluid flow path; and
   second openings through the body, the second openings having second cross sectional shapes and second sizes adapted to, while the first panel is positioned in the fluid flow path, provide physical access to the region proximate to the second side of the server chassis opening frame from the first side of the server chassis opening frame while the first panel is positioned in the fluid flow path.

17. The computing device of claim 15, wherein the first panel comprises:
   first openings that allow gasses to flow through the corresponding fluid flow path, while the first panel is positioned in the corresponding fluid flow path, to the first portion of the computing components,
   wherein the trim piece assembly further comprises a second panel, the second panel comprising:
      second openings that allow the gasses to flow through a second fluid flow path of the fluid flow paths, while the second panel is positioned in the second fluid flow path, to the second portion of the computing components,
   wherein the first panel presents a first impedance to the flow of the gasses through the corresponding fluid flow path while the first panel is positioned in the corresponding fluid flow path, the second panel presents a second impedance to the flow of the gasses through the second fluid flow path while the second panel is positioned in the second fluid flow path, and the first impedance and the second impedance are different to preferentially direct the flow the gasses through the corresponding fluid flow path or the second fluid flow path.

18. An electronic rack, comprising:
   computing devices positioned in the electronic rack, a computing device of the computing devices comprising:
      a server chassis comprising:
         an opening through which gasses flow to thermally manage computing components positioned in the server chassis; and
         a pair of ears positioned on opposite side of the opening; and
      a first portion of computing components being arranged in stacks positioned proximate to the opening, the stacks being separated from each other by channels;
      a second portion of the computing components positioned away from the opening, the first portion being positioned between the second portion and the opening;
   a trim piece assembly, comprising:
      a server chassis opening frame adapted to:
         reversibly attach to a front of the server chassis; and
         structurally reinforce the server chassis while the server chassis opening frame is attached to the front of the server chassis;
      a pair of extensions adapted to reversibly attach to the pair of ears, each of the pair of extensions being positioned on opposite sides of the server chassis opening frame, the server chassis opening frame and the pair of extensions covering a full outer profile of the server chassis while the pair of extensions are attached to the server chassis, the full outer profile of the server chassis circumscribing the opening;
      fluid flow paths through the server chassis opening frame to allow an airflow through the server chassis via the server chassis opening frame while the pair of extensions are attached to the ears of the server chassis; and
      a panel positioned in a fluid flow path of the fluid flow paths, the panel being adapted to manage physical access to the server chassis through the fluid flow path.

19. The electronic rack of claim 18, wherein a second trim piece assembly of a second computing device of the computing devices comprises:
   second fluid flow paths that allow second gasses to flow through a second server chassis of the second computing device while the second trim piece assembly is positioned adjacent to the second server chassis to cover an opening in the second server chassis, the second fluid flow paths corresponding to a distribution of computing component positioned in the second server chassis, the distribution of the computing components positioned in the second server chassis being different from a distribution of the computing components positioned in the server chassis.

20. The electronic rack of claim 18, wherein the panel comprises:
   a body; and
   first openings through the body, the first openings having first cross sectional shapes and sizes adapted to, while the panel is positioned in the fluid flow path, prevent physical access to a region proximate to a second side of the server chassis opening frame from a first side of the server chassis opening frame while the panel is positioned in the fluid flow path; and
   second openings through the body, the second openings having second cross sectional shapes and second sizes adapted to, while the panel is positioned in the fluid flow path, provide physical access to the region proximate to the second side of the server chassis opening frame from the first side of the server chassis opening frame while the panel is positioned in the fluid flow path.

* * * * *